(12) United States Patent
Gyoda et al.

(10) Patent No.: US 7,282,385 B2
(45) Date of Patent: Oct. 16, 2007

(54) ELECTRO-OPTICAL DEVICE, METHOD OF MANUFACTURING ELECTRO-OPTICAL DEVICE, AND ELECTRONIC APPARATUS

(75) Inventors: Kozo Gyoda, Chino (JP); Ryoichi Nozawa, Tatsuno-machi (JP)

(73) Assignee: Seiko Epson Corporation, Tokyo (JP)

( * ) Notice: Subject to any disclaimer, the term of this patent is extended or adjusted under 35 U.S.C. 154(b) by 369 days.

(21) Appl. No.: 11/042,292

(22) Filed: Jan. 26, 2005

(65) Prior Publication Data

US 2005/0186717 A1 Aug. 25, 2005

(30) Foreign Application Priority Data

| Feb. 19, 2004 | (JP) | ............................. 2004-043023 |
| Feb. 19, 2004 | (JP) | ............................. 2004-043024 |
| Feb. 19, 2004 | (JP) | ............................. 2004-043030 |
| Jul. 7, 2004 | (JP) | ............................. 2004-200548 |
| Sep. 30, 2004 | (JP) | ............................. 2004-288665 |

(51) Int. Cl.
*H01L 21/00* (2006.01)

(52) U.S. Cl. ............................. 438/69; 438/48; 438/29; 257/432; 257/98

(58) Field of Classification Search ................. 438/69, 438/48, 29; 257/432, 98
See application file for complete search history.

(56) References Cited

U.S. PATENT DOCUMENTS

| 6,317,175 | B1 * | 11/2001 | Salerno et al. ................. 349/45 |
| 6,573,957 | B1 | 6/2003 | Suzuki |
| 6,759,660 | B2 | 7/2004 | Izumi et al. |
| 6,770,909 | B2 * | 8/2004 | Murade ........................ 257/59 |
| 6,798,030 | B1 * | 9/2004 | Izumi et al. ................. 257/428 |
| 6,828,179 | B2 * | 12/2004 | Yamazaki et al. .......... 438/166 |
| 6,872,672 | B2 * | 3/2005 | Yamazaki et al. .......... 438/780 |
| 2002/0069961 | A1 | 6/2002 | Kobayashi et al. |

(Continued)

FOREIGN PATENT DOCUMENTS

JP A-10-62604 3/1998

(Continued)

OTHER PUBLICATIONS

Laser Cutting of thick ceramic substrates by controlled fracture technique☐☐Chwan-Huei Tsai, Hong-Wen Chen, 2003.*

(Continued)

*Primary Examiner*—Michael Lebentritt
*Assistant Examiner*—Abdulfattah Mustapha
(74) *Attorney, Agent, or Firm*—Oliff & Berridge, PLC

(57) ABSTRACT

To provide a manufacturing method of an electro-optical device capable of effectively forming self-emitting elements in a large substrate on which a plurality of small substrates are arranged in a plane, without increasing the size of a manufacturing apparatus, the electro-optical device manufactured by the method, and an electronic apparatus equipped with the same. When manufacturing an organic EL display device by bonding a plurality of small substrates, processes required for a laser annealing technique and a photolithography technique, such as a process of forming TFTs and a process of forming pixel electrode, are performed before a process of bonding the small substrates to the large substrate, and organic EL elements are formed by an inkjet method after the bonding process. Further, a protective film is formed on the small substrates while the organic EL display elements are being formed.

35 Claims, 20 Drawing Sheets

U.S. PATENT DOCUMENTS

2003/0173891 A1    9/2003    Chiba et al.

FOREIGN PATENT DOCUMENTS

| JP | A-2000-243555 | 9/2000 |
| JP | A 2001-075120 | 3/2001 |
| JP | A 2001-100668 | 4/2001 |
| JP | A 2001-102171 | 4/2001 |
| JP | A-2001-142412 | 5/2001 |
| JP | A-2002-63859  | 2/2002 |
| JP | A-2002-82342  | 3/2002 |
| JP | A-2002-149079 | 5/2002 |
| JP | A 2002-297063 | 10/2002 |
| JP | A-2002-305077 | 10/2002 |
| JP | A-2002-333848 | 11/2002 |
| JP | A-2002-372928 | 12/2002 |
| JP | A-2003-108038 | 4/2003 |
| JP | A-2003-272840 | 9/2003 |

OTHER PUBLICATIONS

Tsai et al. Laser cutting of thick ceramic substrates by controlled fracture technique.*

* cited by examiner

ELECTRO-OPTICAL DEVICE, METHOD OF MANUFACTURING ELECTRO-OPTICAL DEVICE, AND ELECTRONIC APPARATUS

BACKGROUND

The present invention relates to a method of manufacturing an electro-optical device in which self-emitting elements constitute a plurality of pixels, the electro-optical device manufactured by the method, and an electronic apparatus using the same.

In recent years, in addition to light-receiving type liquid crystal display devices, organic electroluminescent (hereinafter, referred to as EL) display devices having thickness reduction, weight reduction, and no viewing angle dependency have attracted considerable attention as self-emitting electro-optical devices. In these organic EL display devices, a display substrate in which a pixel switching element and an organic EL element are arranged in each of a plurality of pixels arranged in a matrix like liquid crystal is used, and display is performed by controlling an ON or OFF state of each pixel. The organic EL element comprises two electrodes and an organic material interposed between the two electrodes that contributes to the emission of light. When electrons and holes are injected from the two electrodes to the light-emitting material each pixel emits light. That is, when the electrons and holes injected from the electrodes are recombined at the light-emitting center of the organic material, organic molecules is in an excited state. Then, when the organic molecules return to a normal state from the excited state, the organic molecules emit light. Therefore, when materials having different emission colors are used, it is possible to display a color image.

When a large organic EL display device having a size larger than 30 inches is required, similar to a liquid crystal display device, a large substrate should grow in size. Therefore, a manufacturing line for the pixel switching TFTs (thin film transistors) becomes large in scale. In addition, the increase in the size of the substrate causes the reduction in yield in a cleaning process or a film forming process. Further, when the TFTs are composed of low-temperature polysilicon TFTs in order to use a low-priced glass substrate as the substrate, a laser annealing process for crystallizing amorphous silicon into polysilicon is unstably performed.

Therefore, there has been proposed a technique of constituting a large organic EL display device by arranging a plurality of substrates in a plane, which have the size enough to be realized by the conventional technique. As such a technique of constituting the large organic EL display device, the following methods have been proposed: a method in which, after pixel switching elements and organic EL elements are formed on a small substrate, a plurality of the small substrates are arranged in a plane; and a method in which, after pixel switching elements are formed on a small substrate, a plurality of the small substrates are arranged in a plane, and organic EL elements are then formed on each of the small substrates. In the latter case, there is an advantage in which a joint between the small substrates is invisible (for example, see Patent Documents 1 and 2).

[Patent Document 1] Japanese Unexamined Patent Application Publication No. 2001-102171.

[Patent Document 1] Japanese Unexamined Patent Application Publication No. 2002-297063

SUMMARY

However, according to the techniques disclosed in Patent Documents 1 and 2, when the organic EL elements are formed in a state in which the plurality of small substrates are arranged in a plane, it is necessary to use the conventional semiconductor processes, and a special technique for forming the organic EL elements in a large area is not adopted. Therefore, there is a problem in that a large manufacturing apparatus should be used to form the organic EL elements.

Further, when the plurality of small substrates is arranged in a plane to constitute a large organic EL display device, the positional deviation of the small substrates occurs in the thickness direction thereof. In addition, when the small substrate is inclined toward the outside of its surfaces, the light-emitting position of each pixel deviates, resulting in the deterioration of display quality.

Furthermore, as described in Patent Documents 1 and 2, when the plurality of small substrates are bonded to the large substrate, the thickness of the electro-optical device becomes large by the thickness of the large substrate, which results in an increase in the weight of the device. In addition, it is impossible to manufacture a new type of electro-optical device having curved substrates. However, when a thin substrate is used from the beginning, the substrate can be damaged during manufacture, which results in the decrease in yield. In addition, it is considered that, after the small substrates are bonded to the large substrate or the sealing substrate (counter substrate) to form a panel, a thinning process is performed on the panel. In this case, when performing the thinning process using chemical etching, terminals formed in the electro-optical device substrate are also etched, resulting in the damage of the terminals.

Accordingly, the present invention is designed to solve the above-mentioned problems, and it is an object of the present invention to provide a manufacturing method of a self-emitting type electro-optical device capable of effectively forming self-emitting elements in a state in which a plurality of small substrates are arranged in a plane, without increasing the size of a manufacturing apparatus, the electro-optical device manufactured by the method, and an electronic apparatus equipped with the same.

Further, it is another object of the present invention to provide a method of manufacturing an electro-optical device in which, even when a plurality of small substrates are arranged in a plane, the positional deviation of the small substrates in the thickness direction thereof does not occur and the small substrate is not inclined toward the outside of its surface, the electro-optical device manufactured by the method, and an electronic apparatus equipped with the same.

Furthermore, it is still another object of the present invention to provide a method of manufacturing an electro-optical device capable of effectively thinning down small substrates during a manufacturing process, the electro-optical device manufactured by the method, and an electronic apparatus equipped with the same.

Moreover, it is yet still another object of the present invention to provide a method of manufacturing an electro-optical device capable of thinning down a panel obtained by bonding small substrates to a counter substrate, without damaging terminals of the panel, the electro-optical device manufactured by the method, and an electronic apparatus equipped with the same.

In order to achieve the above-mentioned objects, the present invention provides a method of manufacturing an electro-optical device in which a plurality of substrates each having a plurality of pixel region arranged in a matrix are arranged in a plane, each of the plurality of pixel regions including a pixel switching element and a self-emitting element. The method comprises a step of forming a small substrate having the pixel switching elements and pixel electrodes of the self-emitting elements on one surface thereof; a step of bonding a large substrate to the other surfaces of a plurality of small substrates arranged in a plane; and a step of forming a light-emitting functional layer of the self-emitting element by selectively applying a liquid composition to a predetermined region of the one surface of each of the plurality of small substrates using an inkjet method.

In the present invention, processes required for a laser annealing technique or a photolithography technique, such as a process of forming the pixel switching elements and a process of forming the pixel electrodes of the self-emitting elements in the small substrate, are performed before the small substrates are bonded to the large substrate. In addition, after the bonding process, the light-emitting functional layer of the self-emitting elements is formed by an inkjet method capable of easily applying a liquid material at any position. Thus, even when the light-emitting functional layer of the self-emitting element is formed in a large area where the plurality of small substrates are arranged in a plane, it is possible to prevent an increase in the size of the device and a decrease in manufacturing yield.

According to the present invention, in the bonding step, the small substrates and the large substrate are bonded to each other by, for example, an adhesive.

Further, in the present invention, preferably, a step of cutting one or more of a plurality of sides of one small substrate adjacent to other small substrates in the electro-optical device using a laser is performed before the bonding step. This structure makes it possible to accurately bond the small substrates each other, thereby improving the positional accuracy between the small substrates on the large substrate. In addition, when forming the light-emitting functional layer of the self-emitting element using an inkjet method, it is possible to form the light-emitting functional layer at a predetermined position on the small substrate with high positional accuracy since high positional accuracy is obtained between the small substrates. Further, preferably, alignment marks indicating positions where a laser beam is irradiated are formed on the small substrate.

In the present invention, the protective film adheres to at least the one surface of each of the small substrates after the small substrate forming step. Then, the protective film is removed from the one surface of each of the small substrates after the bonding step, and the light-emitting functional layer forming step is then performed. According to this structure, during the bonding process, it is possible to protect the one surface of the small substrate on which the pixel switching elements are formed from impurities or damage, thereby improving the reliability of the device.

According to the present invention, in the bonding step, preferably, the plurality of small substrate are arranged such that the protective film faces a surface plate, and in this state, the large substrate is bonded to the other surfaces of the plurality of small substrates. According to this structure, it is possible to bond the large substrate on the basis of the one surface of each of the small substrates on which the protective film is formed. Therefore, when forming the light-emitting functional layer of the self-emitting element using the inkjet method, a distance from an inkjet head to one surface of each of the small substrates is uniform. Thus, it is possible to prevent the deviation of the forming position of the light-emitting functional layer or a variation in brightness caused by a variation in the falling distance of a liquid droplet from the inkjet head to the one surface.

According to the present invention, in the bonding step, preferably, the large substrate is placed in contact with the other surfaces of the plurality of small substrates arranged on the surface plate, and in this state, fluid pressure is applied to the large substrate to press against the surface plate such that the large substrate is bonded to the other surfaces of the plurality of small substrates. According to this structure, since uniform force is applied to the small substrates and the large substrate, it is possible to bond all small substrates to the large substrate in the same condition. Therefore, it is possible to prevent the positional deviation of the small substrates constituting the electro-optical device in the thickness direction thereof and thus to display a high-quality image.

According to the present invention, in the bonding step, preferably, the large substrate and the small substrates are bonded to each other with first substrate-gap-controlling members for controlling a gap between the substrates interposed between the large substrate and the small substrates. According to this structure, since the gap in the thickness direction between the small substrates and the large substrate is defined by the first substrate-gap-controlling members, the positional deviation of the small substrates in the thickness direction thereof does not occur, and the small substrates are not inclined toward the outside of their surfaces. Therefore, in the case of a bottom-emission-type display device in which display light is emitted from the large substrate, it is possible to align the light-emitting position of each pixel seen from an observer. Thus, it is possible to provide an organic EL display device capable of displaying a high-quality image without display distortion. In addition, in the case of both the top-emission-type and the bottom-emission-type display devices, when forming the light-emitting functional layer of the self-emitting element using the inkjet method, the distance from the inkjet head to one surface of each of the small substrates is uniform. Therefore, it is possible to prevent the deviation of the forming position of the light-emitting functional layer or a variation in brightness caused by a variation in the falling distance of a liquid droplet from the inkjet head to the one surface. Thus, the present invention can improve display quality.

In the present invention, the first substrate-gap-controlling members are, for example, projections formed on the small substrates or the large substrate. In this case, the first substrate-gap-controlling members are composed of, for example, a photosensitive resin formed by a photolithography technique. In addition, the first substrate-gap-controlling members are preferably composed of a resin composition fixed on the small substrates or the large substrate by a transferring method, a printing method, or an inkjet method. In any case, the first substrate-gap-controlling members are preferably formed in regions other than the region overlapping the forming region of the self-emitting element in plan view. According to this structure, in the bottom-emission-type electro-optical display device, even when the first substrate-gap-controlling members are interposed between the small substrates and the large substrate, it is possible to prevent the deterioration of display quality caused by the first substrate-gap-controlling members since the first substrate-gap-controlling members are not formed on the emission path of display light.

Further, in the present invention, preferably, the first substrate-gap-controlling members are granular or rod-shaped gap materials dispersed between the small substrates and the large substrate. Since it is impossible to control the forming position of the gap material, the gap material may exist on the emission path of display light. Therefore, in the case of the bottom-emission-type display device, the gap material preferably has substantially the same refractive index as that of the large substrate or the small substrate.

Furthermore, in the present invention, after forming the self-emitting elements, a sealing step of bonding a sealing substrate to the one surface of each of the small substrates is performed. In this case, in the sealing step, the small substrates and the sealing substrate are bonded to each other by a sealing resin.

Moreover, according to the present invention, in the sealing step, the sealing substrate and the small substrates are bonded to each other with second substrate-gap-controlling members for controlling a gap between the substrates interposed between the sealing substrate and the small substrates. According to this structure, it is possible to accurately bond the small substrates to the sealing substrate at regular gaps. Therefore, in the case of the top-emission-type display device in which display light is emitted from the sealing substrate, it is possible to align the light-emitting position of each pixel seen from an observer, thereby improving display quality. In addition, in the case of both the top-emission-type and the bottom-emission-type display devices, when the small substrates and the sealing substrate are bonded to each other with high accuracy, it is possible to accurately cut the sealing substrate. That is, in a step of cutting a portion of the sealing substrate using a scribing apparatus to expose terminal forming regions on the small substrates, it is possible to easily cut the sealing substrate with high accuracy.

Further, in the present invention, the second substrate-gap-controlling members are, for example, projections formed on the small substrates or the sealing substrate. In this case, the second substrate-gap-controlling members are composed of a photosensitive resin formed by a photolithography technique. In addition, preferably, the second substrate-gap-controlling members are composed of a resin composition fixed on the small substrates or the sealing substrate by a transferring method, a printing method, or an inkjet method. In any case, the second substrate-gap-controlling members are preferably formed in regions other than the region overlapping the forming region of the self-emitting element in plan view. According to this structure, since stress from the sealing substrate is not transmitted to the self-emitting elements through the projections, it is possible to prevent the damage of the self-emitting elements and the display device. Further, in the bottom-emission-type electro-optical display device, even when the second substrate-gap-controlling members are interposed between the small substrates and the sealing substrate, it is possible to prevent the deterioration of display quality caused by the second substrate-gap-controlling members since the second substrate-gap-controlling members are not formed on the emission path of display light.

Furthermore, in the present invention, preferably, the second substrate-gap-controlling members are granular or rod-shaped gap materials dispersed between the small substrates and the sealing substrate. Since it is impossible to control the forming position of the gap material, the gap material may exist on the emission path of display light. Therefore, in the case of the top-emission-type display device, the gap material preferably has substantially the same refractive index as that of the sealing substrate or the small substrate.

In order to solve the above-mentioned problems, in the present invention, first, a predetermined process is performed on an electro-optical device substrate for holding an electro-optical material. Then, a step of fixing the plurality of small substrate arranged in a plane to a surface plate using wax after is performed. Subsequently, in this state, a step of thinning down the small substrates by polishing the surfaces of the small substrates is performed. Then, after the thinning step, a step of detaching the small substrates from the surface plate by melting the wax by heating is performed.

According to the present invention, in order to thin down the small substrate, after a predetermined process is performed on a small substrate in a normal state, the thinning step is performed thereon. Therefore, the small substrate composed of a hard substrate made of glass is thinned down to a thickness of 100 μm or less. For example, even when the small substrate is 50 μm in thickness, the small substrate is not damaged during a manufacturing process. In addition, it is possible to collectively polish a plurality of electro-optical device substrates. Further, since a mechanical polishing method, not a chemical etching method, is performed to thin down the small substrates, the surfaces of the small substrates become smooth. In case of the mechanical polishing, since it is possible to selectively polish one surface of the small substrate, the terminals on the substrate are not damaged. Even when a pair of substrates are bonded to each other by a sealing material as in a liquid crystal device, the sealing material does not deteriorate in the present invention. Further, since the electro-optical device substrate is fixed to the surface plate by repeatedly performing the fusion and solidification of the wax, it is possible to easily detach the substrate from the surface plate after polishing. In the fixation of the substrate by the wax, since stress for fixation is not concentrated on a portion of a component during the manufacturing process, the substrate is not damaged. In addition, the wax is melted at a temperature of about 80° C. Therefore, although the thinning step is performed after an electro-optical material, such as liquid crystal or an EL material, is held in the small substrate, the electro-optical material does not deteriorate. Further, since surfaces of the plurality of small substrates are planarly arranged at the same height by polishing, it is possible to easily bond the large substrate to the small substrates with high accuracy.

In the thinning step of the present invention, preferably, a rubbing step of thinning down the small substrates in a state in which the small substrates are fixed to the surface plate by the wax and a polishing step of smoothly polishing the surfaces of the small substrates are sequentially performed.

In the fixing step of the present invention, the wax put in a concave portion formed on an upper surface of the surface plate is melted by heating. Then, the plurality of small substrates is deposited on the melted wax, and fluid pressure is applied to the plurality of small substrates to press against the surface plate. Subsequently, the wax is solidified by cooling such that the plurality of small substrates is fixed to the surface plate by the wax. As a method of applying the fluid pressure, the following methods can be used: a method of ejecting compressed air from a head toward the upper surface of the small substrate; and a method of forming a partition film having elasticity on the substrate and of supplying a fluid into one of two spaces partitioned by the partition film, in which the one space is opposite to the side where the substrate is arranged. In this way, since uniform force can be applied to the respective small substrates, it is possible to fix the small substrates to the surface plate at accurate positions and thus to accurately polish the small substrates.

In the present invention, the large substrate is bonded to the plurality of small substrates on the surface plate to form a bonded substrate in which the plurality of small substrates are arranged in a plane on the large substrate, and the bonded substrate is then detached from the surface plate by melting the wax by heating. Then, an electro-optical device in which the plurality of small substrates is planarly arranged on the large substrate is preferably manufactured using the bonded substrate.

In the bonding step of the present invention, preferably, the fluid pressure is applied to the large substrate in a state in which the large substrate is placed in contact with the plurality of substrate for electro-optical device on the surface plate, such that the large substrate presses against the surface plate. In this case, as a method of applying the fluid pressure, the following methods can be used: a method of ejecting compressed air from a head toward the large substrate; and a method of forming a partition film having elasticity on the substrate and of supplying a fluid such air or liquid into one of two spaces partitioned by the partition film, in which the one space is opposite to the side where the large substrate is arranged. In this way, since uniform force can be applied to the small substrates and the large substrate, it is possible to bond all small substrates to the large substrate in the same condition. Therefore, it is possible to prevent the positional deviation of the small substrate in the thickness direction thereof and thus to display a high-quality image.

The small substrate of the present invention may be, for example, a liquid crystal device substrate obtained by bonding a pair of substrates with a sealing material interposed therebetween. In addition, the electro-optical device substrate of the present invention is a substrate for an electro-optical device, such as an organic EL display device.

According to the present invention, the electro-optical device in which the plurality of electro-optical device substrates are arranged in a plane on the large substrate is manufactured using the bonded substrate obtained by the following steps: the small substrate forming step of forming the pixel switching elements and the pixel electrodes of the self-emitting elements in the one surface of the small substrate; the fixing step of fixing the plurality of small substrates arranged in a plane to the surface plate by the wax, with the electrode surfaces facing downward; the polishing step of polishing the other surfaces of the plurality of small substrates; the bonding step of manufacturing the bonded substrate by bonding the large substrate to the polished surfaces of the plurality of small substrates; the detaching step of detaching the bonded substrate from the surface plate by melting the wax; and the light-emitting functional layer forming step of forming the light-emitting functional layer of the self-emitting elements on one surface (electrode) of the bonded substrate composed of the plurality of small substrates. That is, processes required for a laser annealing technique or a photolithography technique, such as a process of forming the pixel switching elements and a process of forming the pixel electrodes of the self-emitting elements, are performed before the small substrates are bonded to the large substrate. In addition, after the bonding process, the light-emitting functional layer of the self-emitting element is formed. Therefore, when forming the light-emitting functional layer of the self-emitting element, it is possible to adopt an inkjet method capable of easily applying a functional material at any position. If adopting such an inkjet method, it is possible to prevent an increase in the size of the manufacturing apparatus and a decrease in yield when the light-emitting functional layer of the self-emitting element is formed in a large area where the plurality of small substrates are arranged in a plane.

In the present invention, preferably, the large substrate is thinned down by polishing the surface of the large substrate in a state in which the bonded substrate is fixed to the surface plate by the wax, and the bonded substrate is then detached from the surface plate by melting the wax by heating. According to this structure, it is possible to achieve a thin and light electro-optical device.

In the present invention, preferably, after the sealing substrate is bonded to the one surface of each of the plurality of small substrate constituting the bonded substrate to form a module, the sealing substrate is thinned down by polishing the surface of the sealing substrate in a state in which the module is fixed to the surface plate by the wax, and the module is then detached from the surface plate by melting the wax by heating. According to this structure, it is possible to achieve a thin and light electro-optical device.

Further, in the present invention, the electro-optical device substrate has a plurality of terminals, and the method further comprises a step of cutting the sealing substrate such that the terminals are exposed after the step of thinning down the sealing substrate.

In the present invention, in order to thin down the panel, after the small substrates and the sealing substrate are bonded to each other, the thinning step is performed. Therefore, even when the sealing substrate made of glass is thinned down to a thickness of 100 µm or less, preferably a thickness of 50 µm or less, the counter substrate is not damaged during a manufacturing process. In addition, since a mechanical polishing method, not a chemical etching method, is performed to thin down the small substrate, the terminals formed on the small substrate are not etched. Further, in the polishing step, since the terminals are covered with the sealing substrate, the terminals are not damaged. After completing the polishing step, it is possible to detach the panel from the surface plate only by melting the wax. In addition, the exposure of the terminals is easily performed by cutting the sealing substrate after the polishing step.

According to the present invention, in the cutting step, the sealing substrate is preferably cut by a laser. In this way, it is possible to effectively cut the sealing substrate in the panel state.

In the present invention, preferably, the small substrate has partition walls for defining regions in which the liquid composition is applied, and the protective film has an adhesive layer formed on one surface of a film base to have a thickness smaller than the height of the partition walls. According to this structure, it is possible to prevent air bubbles from being generated between the small substrates and the protective film. As a result, unevenness does not occur on the surface of the protective film bonded to the small substrates. Therefore, even when the large substrate and the small substrates are bonded to each other on the basis of the surface of the protective film, it is possible to accurately align the positions of the one surface of each of the plurality of small substrates. Thus, it is possible to stably form the light-emitting functional layer of the self-emitting element using an inkjet method. In addition, it is possible to prevent the positional deviation of the respective small substrates in the thickness direction thereof when forming a large electro-optical device, thereby displaying a high-quality image.

In the present invention, the small substrate has partition walls for defining regions in which the liquid composition is applied. Further, in the protective film, a lyophobic material layer with respect to the liquid composition and an adhesive layer having a thickness larger than the height of the partition walls are formed on one surface of a film base. In addition, when the protective film is removed, the lyophobic material layer is preferably transferred around the regions in which the liquid composition is applied in the small substrate. In this way, it is unnecessary to perform a special lyophobic process, such as a plasma process, on the one surface of the small substrate. Therefore, it is possible to reduce the number of manufacturing processes.

The electro-optical device according to the present invention is preferably applied to various electronic apparatuses, particularly, to electronic apparatuses having a large screen larger than 30 inches.

DETAILED DESCRIPTION OF EMBODIMENTS

Hereinafter, an organic EL display device (a self-emitting electro-optical device) and an electronic apparatus using the same according to the present invention will be described with reference to the accompanying drawings. In the figures, which will be referred to in the following description, each component has different dimension and reduced scale from its actual dimension and reduced scale so as to be easily viewed in the figures.

First Embodiment (Overall Structure of Organic EL Display Device)

Figure 1A:
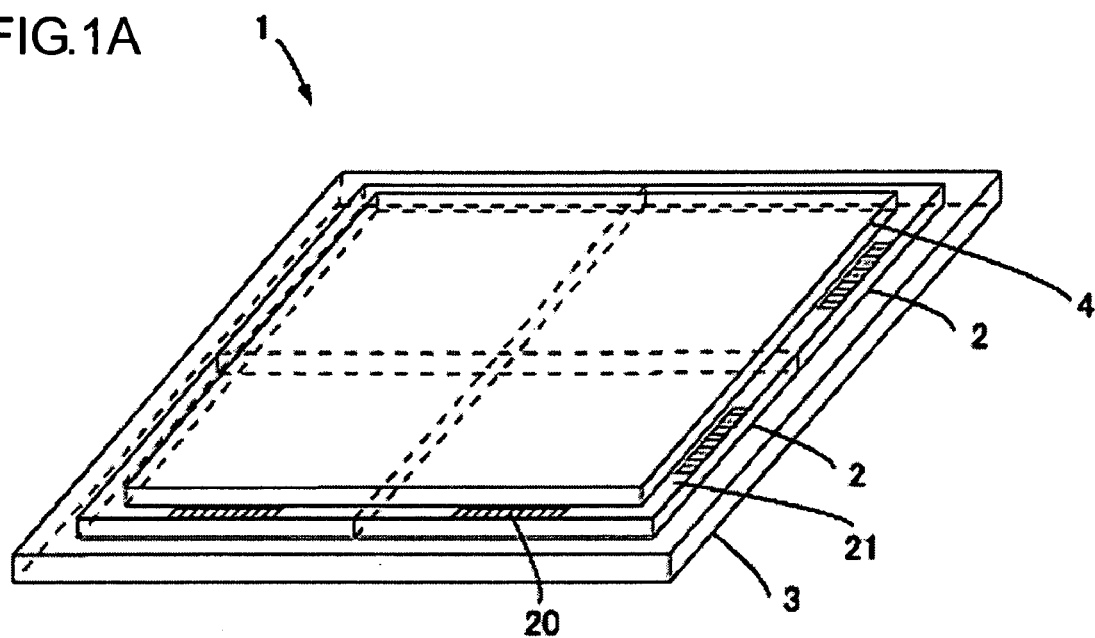
FIGS. 1(A) and 1(B) are a perspective view and a plan view respectively illustrating an active matrix organic EL display device according to an embodiment of the present invention.
Figure 1B:
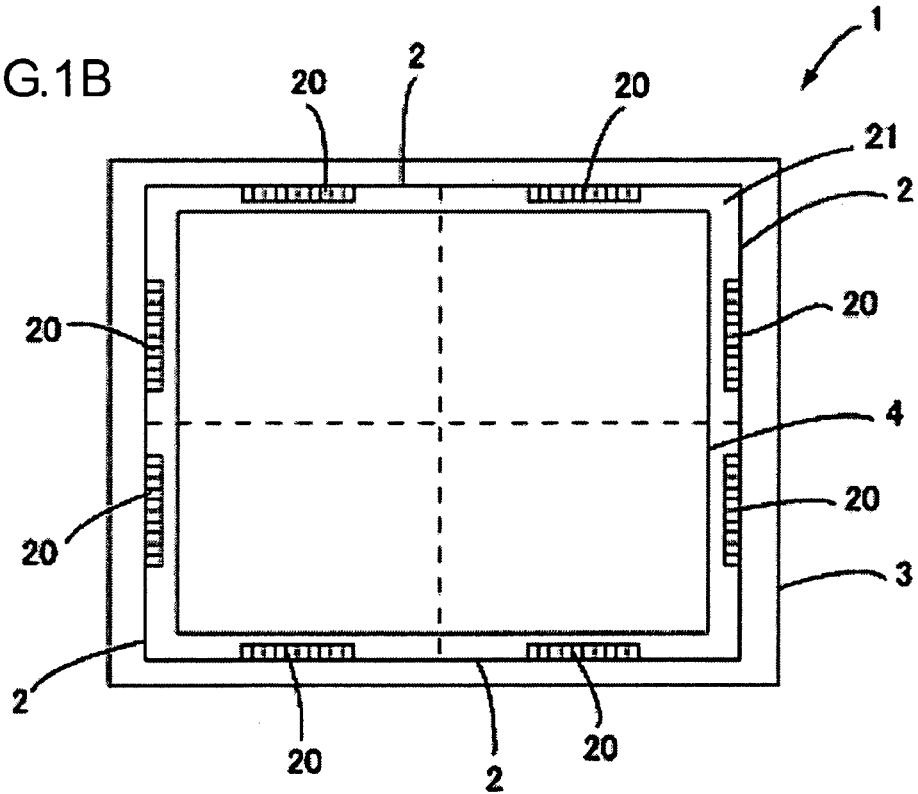
Figure 2:
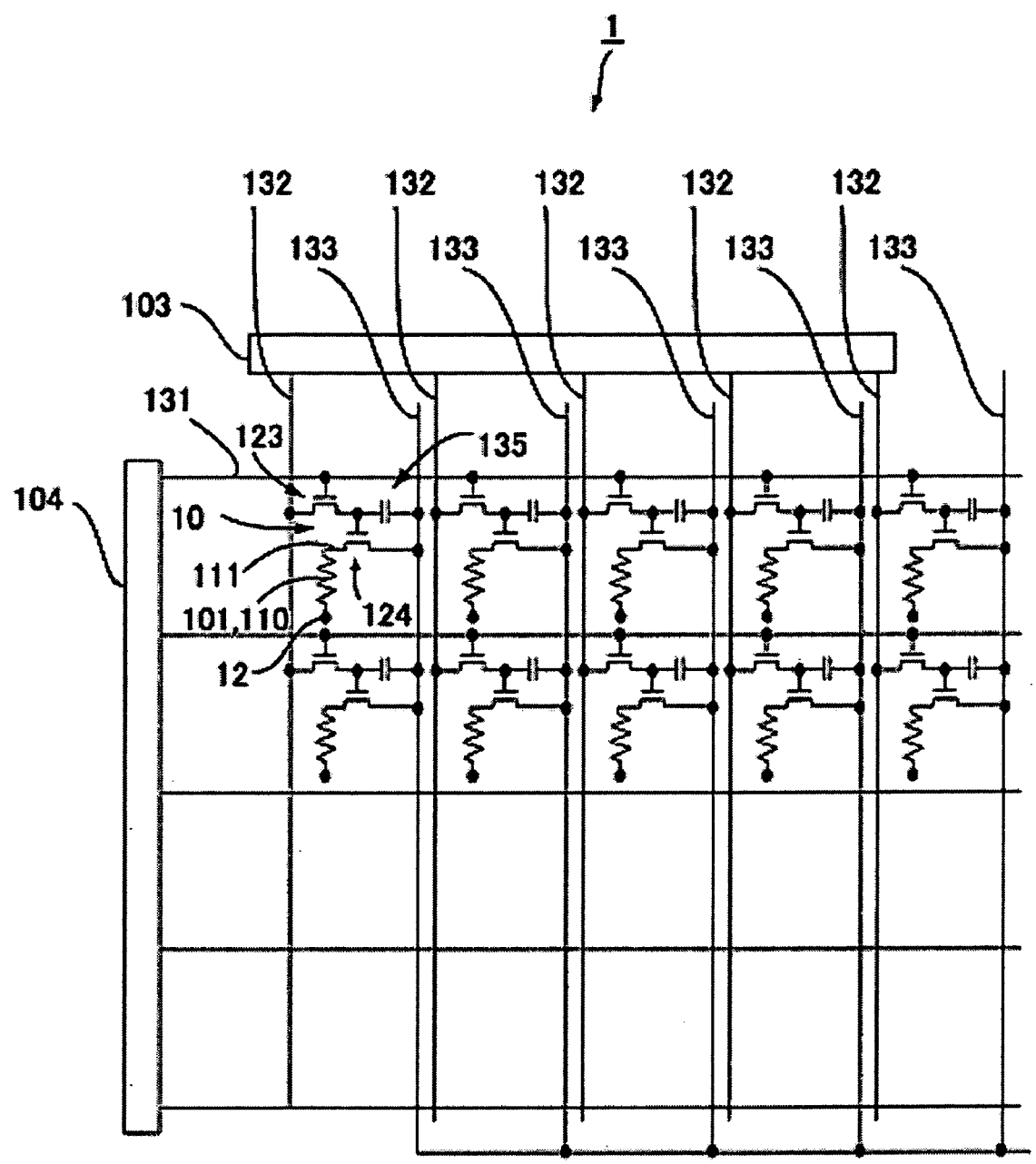
FIG. 2 is an explanatory diagram illustrating the electrical structure of the organic EL display device.
Figure 3:
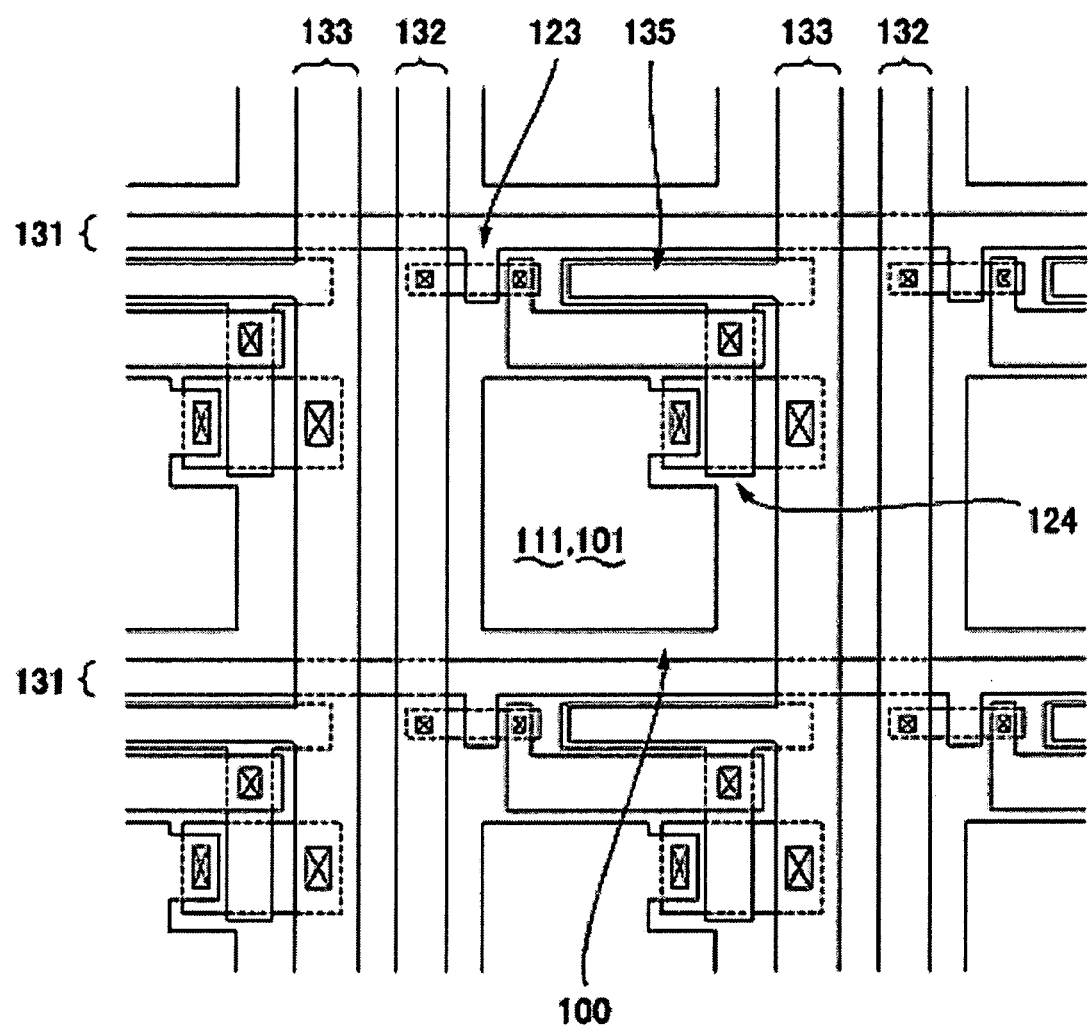
FIG. 3 is a plan view schematically illustrating some of a plurality of pixels formed in an electro-optical device.
Figure 4A:
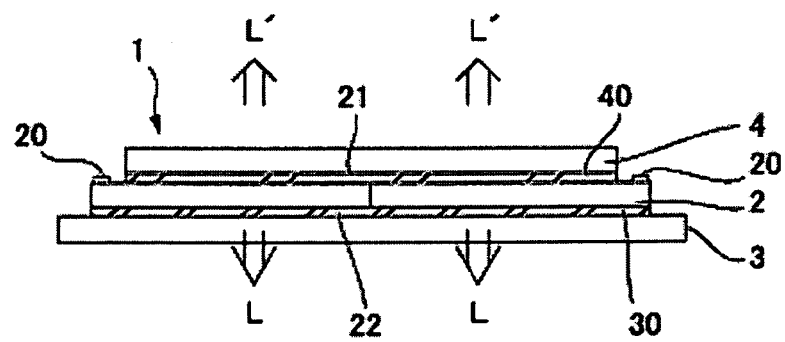
FIG. 4(A) is a plan view of an organic EL display device according to a first embodiment of the present invention.
Figure 4B:
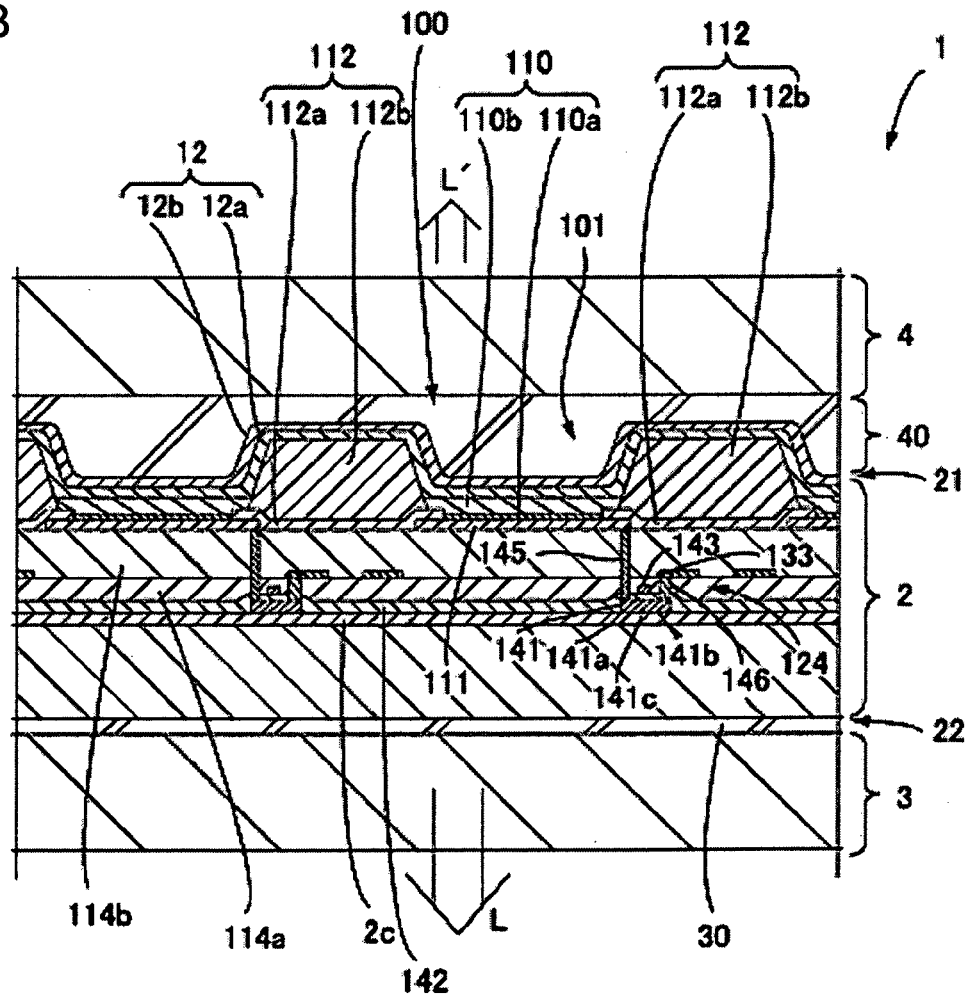
FIG. 4(B) is an enlarged cross-sectional view schematically illustrating the sectional structure of one pixel region in the organic EL display device.

FIGS. 1(A) and 1(B) are a perspective view and a plan view of an active matrix type organic EL display device according to an embodiment of an electro-optical device according to the present invention, respectively. FIG. 2 is an explanatory diagram illustrating the electrical structure of the organic EL display device. FIG. 3 is a plan view schematically illustrating some of a plurality of pixels provided in the electro-optical device. FIG. 4(A) is a cross-sectional view of the organic EL display device according to a first embodiment of the present invention, and FIG. 4(B) is an exploded cross-sectional view illustrating the sectional structure of a pixel region.

In FIGS. 1 and 4(A), an organic EL display device 1 according to the present embodiment is a large display device having a size larger than 30 inches that is manufactured by a so-called tiling technique. In the organic EL display device 1, a plurality of small substrates 2 (TFT array substrates) (four small substrates in the present embodiment) arranged in a plane are bonded to a large substrate 3. That is, a surface 22 (a lower surface) of each of the small substrates 2 and the larger substrate 3 are entirely boned to each other by a transparent adhesive 30. In addition, a sealing substrate 4 is bonded to upper surfaces (which are opposite to the larger substrate 3) of the small substrates 2. The sealing substrate 4 is a substrate for preventing the oxidation of a cathode 12 or an organic functional layer 110 by keeping water or oxygen from being permeated thereinto, and a sealing resin 40, such as epoxy resin, entirely adheres to upper surfaces 21 of the small substrates 2. The adhesive 30 includes an acryl-based adhesive having substantially the same transmittance as that of glass used for the large substrate 3 and the sealing substrate 4.

The large substrate 3 has a size larger than a total size of the plurality of small substrates 2. Further, the sealing substrate 4 has a size smaller that the total size of the plurality of small substrates 2, and a portion of one surface (the upper surface) 21 of each of the small substrates 2 protrudes from the edge of the sealing substrate 4. Therefore, it is possible to electrically connect an external circuit, such as a flexible wiring substrate (not shown), to a terminal forming region 20 formed in an end portion of the upper surface 21 of the small substrate 2.

Furthermore, the small substrate 2 is thinned down to a thickness of 100 μm or less, and more preferably, 50 μm or less by a thinning process, which will be described later.

FIG. 2 is an equivalent circuit diagram of the organic EL display device 1 according to the present embodiment. In the display device according to the present embodiment, wiring lines composed of a plurality of scanning lines 131, a plurality of signal lines 132 arranged orthogonal to the scanning lines 131, and a plurality of power lines 133 extending parallel to the signal lines are formed on the small substrate 2. In addition, pixel regions 100 are formed at intersections of the scanning lines 131 and the signal lines 132, respectively. The signal lines are connected to a signal line driving circuit 103 comprising a shift register, a level shifter, a video line, and an analog switch. In addition, the scanning lines 131 are connected to a scanning line driving circuit 104 comprising a shift register and a level shifter.

(Structure of Pixel)

As shown in FIGS. 2, 3, and 4(B), each pixel region 100 has a pixel switching TFT 123 to which a scanning signal is supplied through the scanning line 131, a storage capacitor 135 for storing an image signal supplied from the signal line 132 through the TFT 123, an image driving TFT 124 to which the image signal stored by the storage capacitor 135 is supplied, and a display element 101.

As shown in FIG. 4(B), in order to form the TFTs 123 and 124, a base protective film 2c formed of a silicon oxide film is formed on the small substrate 2 composed of a glass substrate. An island-shaped semiconductor film 141 composed of a low-temperature polysilicon film is formed on the base protective film 2c. A source region 141a and a drain region 141b are formed in the semiconductor film 141 by injecting high-concentration phosphorous (P) ions, and a portion into which the p-ions are injected is a channel region 141c. A gate insulating film 142 is formed on the base protective film 2c and the semiconductor film 141, and gate electrodes 143 (a part of the scanning lines) each made of Al, Mo, Ta, Ti, or W are formed on the gate insulating film 142. First and second transparent interlayer insulating films 114a and 114b are formed on the gate electrode 143 and the gate insulating film 142, respectively. The gate electrodes 143 are provided at positions corresponding to the channel regions 141c of the semiconductor film 141. Further, contact holes 145 and 146 respectively connected to the source and drain regions 141a and 141b of the semiconductor film 141 are formed in the first and second interlayer insulating films 114a and 114b. Pixel electrodes 111 made of a transparent material, such as ITO, are patterned on the second interlayer insulating film 114b to have a predetermined shape. The TFT 124 is connected to the pixel electrode 111 through the contact hole 145.

The pixel region 100 further includes the organic EL element 101 (a self-emitting element) comprising the pixel electrode (an anode) 111 connected to the power line 133 when the TFT 124 is in an on state and a light-emitting functional layer 110 (an organic functional layer) interposed between the pixel electrode 111 and the cathode 12.

The organic functional layer 110 is composed of for example, a hole injecting/transporting layer 110a formed on the pixel electrode 111 and a light-emitting layer (an organic EL layer) 110b formed on the hole injecting/transporting layer 110a. In addition, an electron injecting/transporting layer may be formed between the light-emitting layer 110b and the cathode. The hole injecting/transporting layer 110a has a function for injecting holes into the light-emitting layer 110b and a function for transporting the holes in the hole injecting/transporting layer 110a. The holes injected from the hole injecting/transporting layer 110a and the electrons injected from the cathode 12 are recombined in the light-emitting layer to emit light. Here, the plurality of pixel regions 100 are composed of pixel regions corresponding to red (R), pixel regions corresponding to green (G), and pixel regions corresponding to blue (B), and such color correspondence depends on a material constituting the organic functional layer 110.

The cathode 12 is composed of a calcium layer 12a and an aluminum layer 12b and is formed almost the entire region of the small substrate 2 except regions in which terminals are formed. The aluminum layer 12b is a layer for reflecting light emitted from the light-emitting layer 110b toward the small substrate 2 and may be formed of an Ag film or a laminated film of the Al-film and the Ag-film, in addition to the Al-film.

In the organic EL display device 1 according to the present embodiment, a partition wall 112 for surrounding the edge of the pixel electrode 111 is formed in the pixel region 100. As described later, the partition wall 112 is a member for defining regions in which a liquid composition will be ejected and applied by an inkjet method (a liquid ejecting method) when the organic functional layer 110 is formed, and the liquid composition is formed with a uniform thickness by the surface tension of the partition wall. In the present embodiment, the partition wall 112 is composed of, for example, an inorganic partition wall layer 112a and an organic partition wall layer 112b formed on the inorganic partition wall layer 112a. The inorganic partition wall layer 112a is made of an inorganic material, such as $SiO_2$ or $TiO_2$. The organic partition wall layer 112b is made of a resist having heat resistance and solvent resistance, such as acryl resin or polyimide resin.

In the organic EL display device 1 having the above-mentioned structure, when the scanning line 131 is driven to turn on the TFT 123, the potential of the signal line 132 at that time is stored in the storage capacitor 135, and the electrical connection of the driving TFT 124 is controlled according to the state of the storage capacitor 135. In addition, when the driving TFT 124 is in the on state, a current flows to the pixel electrode 111 from the power line 133 through the channel of the driving TFT 124, and a current flows to the cathode 12 through the organic functional layer 110 in the organic EL element. Then, the organic functional layer 110 emits light according to the amount of current at that time. In this case, since the organic EL display device 1 is a bottom-emission-type, light emitted from the organic functional layer 110 to the large substrate 3 is emitted to an observer side, and on the other hand, light emitted from the organic functional layer 110 to the side opposite to the large substrate 3 is reflected from the cathode 12 and is then emitted from the large substrate 3 to the observer side, as represented by arrow L in FIGS. 4(A) and 4(B).

Further, when a reflective layer is formed on the side of the pixel electrode 111 and the cathode 12 is made of a transmissive material, it is possible to constitute a top-emission-type organic EL display device in which display light is emitted from the sealing substrate 4 as represented by arrow L' in FIGS. 4(A) and 4(B).

(Manufacturing Method)

Figure 5A:
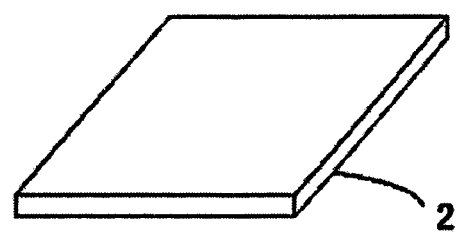
FIGS. 5(A) and 5(B) are explanatory diagrams illustrating a small substrate forming process of a method of manufacturing the organic EL display device according to the present invention.
Figure 5B:
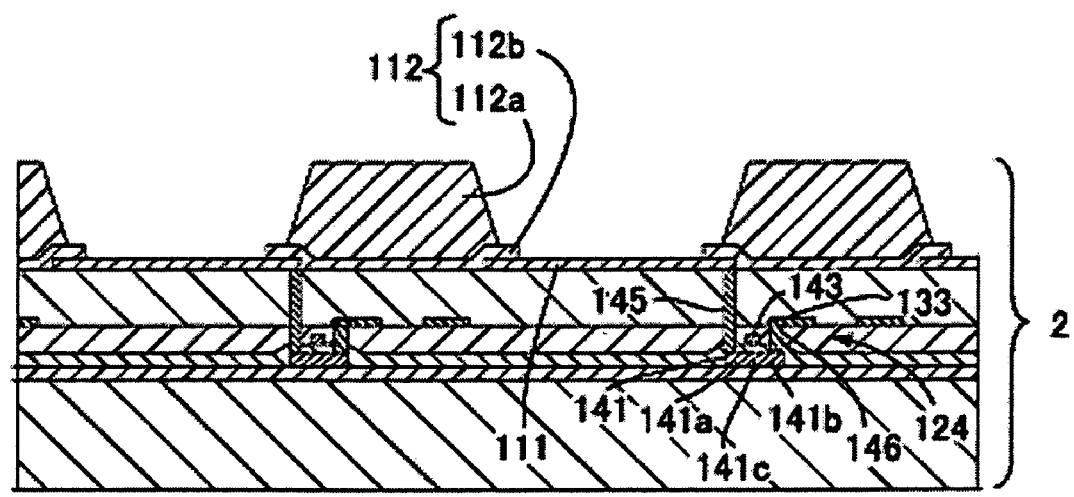
Figure 6A:
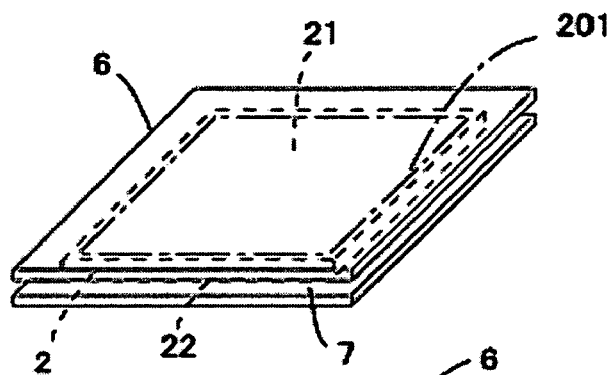
FIGS. 6(A), 6(B), and 6(C) are explanatory diagrams illustrating a state in which a protective film adheres to a small substrate in the method of manufacturing the organic EL display device according to the present invention.
Figure 6B:
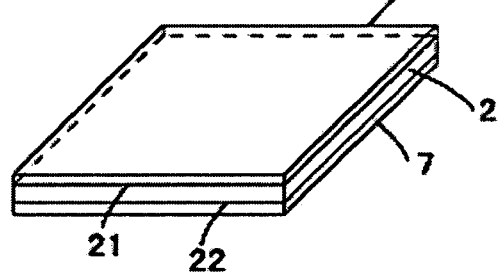
Figure 6C:
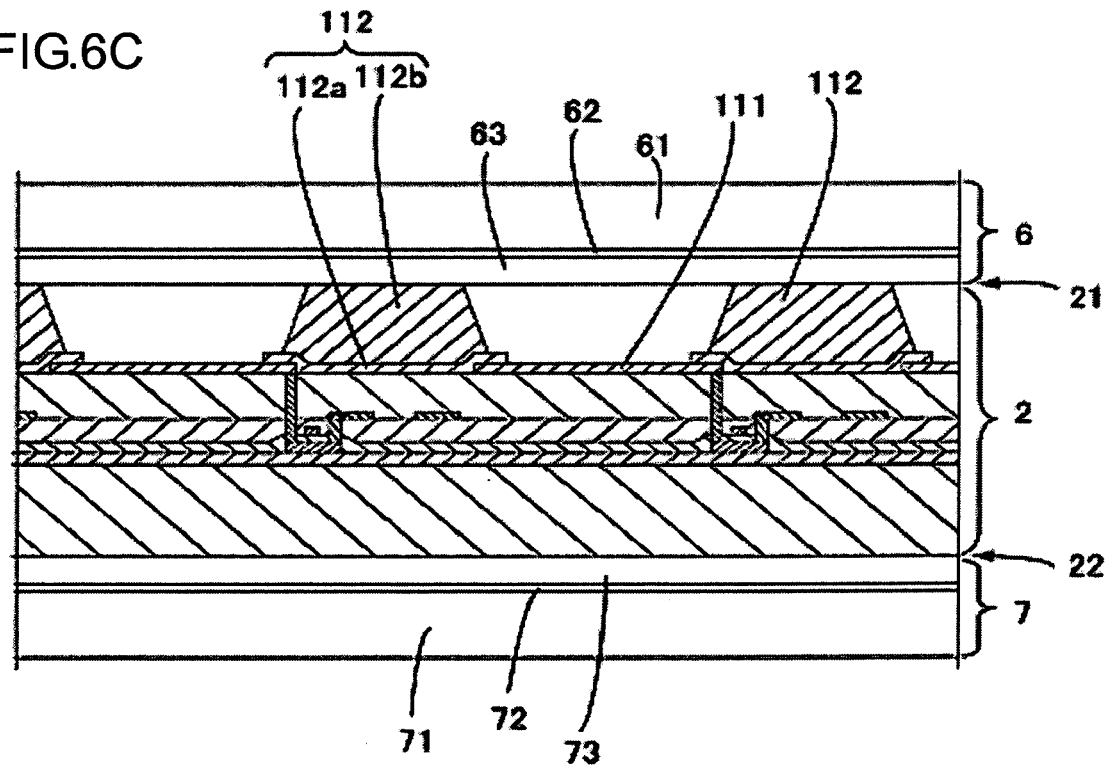
Figure 7A:
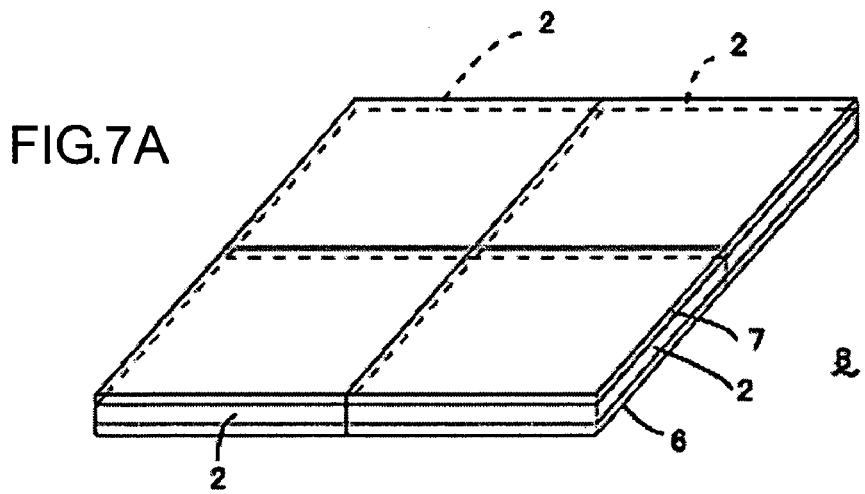
FIGS. 7(A), 7(B), and 7(C) are explanatory diagrams illustrating a bonding process in the method of manufacturing the organic EL display device according to the present invention.
Figure 7B:
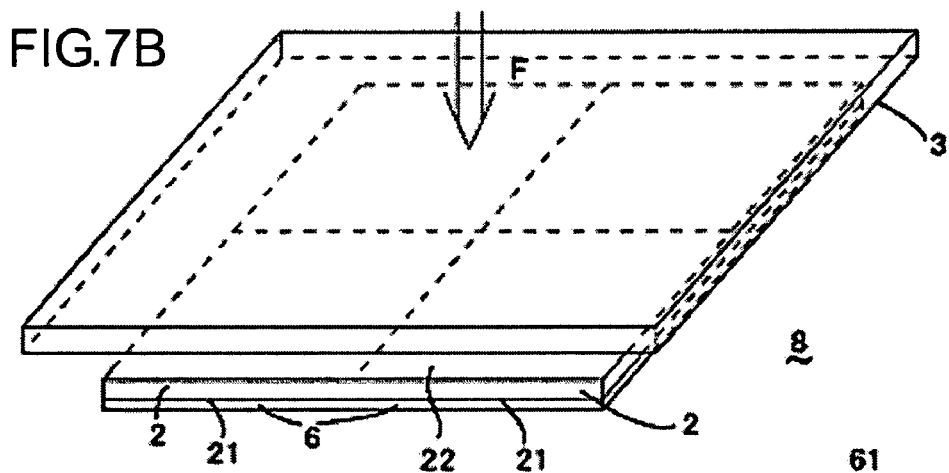
Figure 7C:
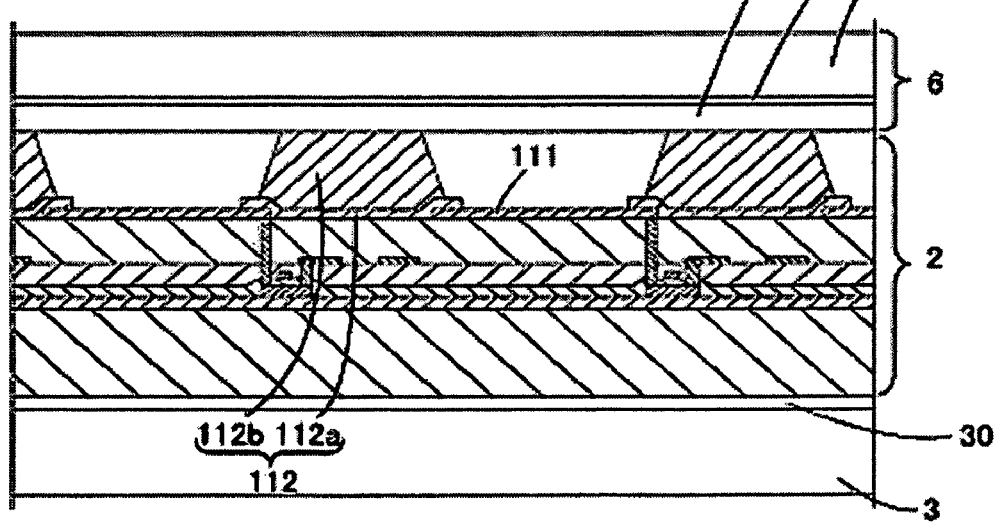
Figure 8A:
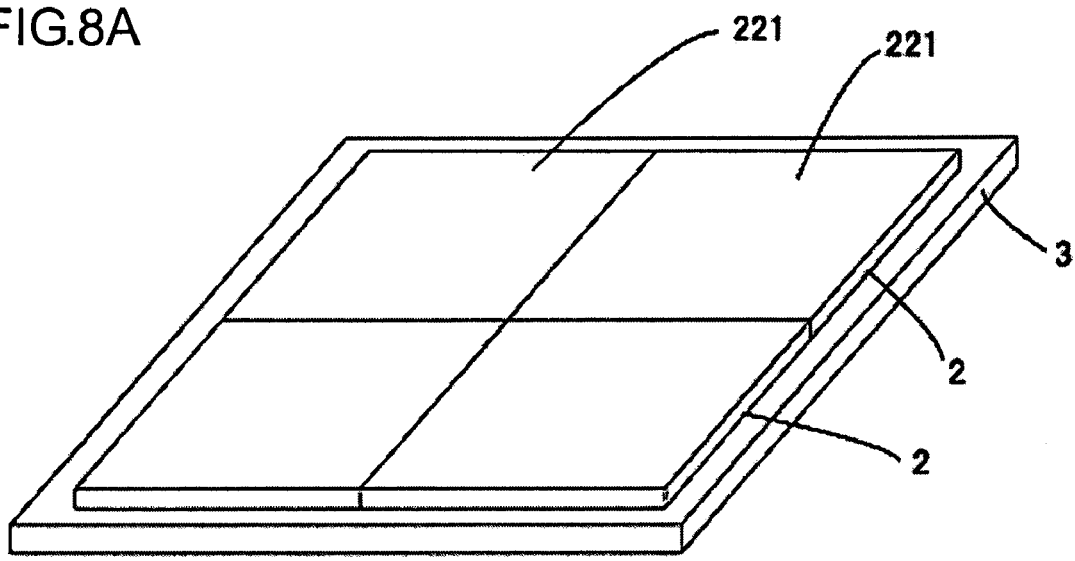
FIGS. 8(A) and 8(B) are explanatory diagrams illustrating an organic functional layer forming process in the method of manufacturing the organic EL display device according to the present invention.
Figure 8B:
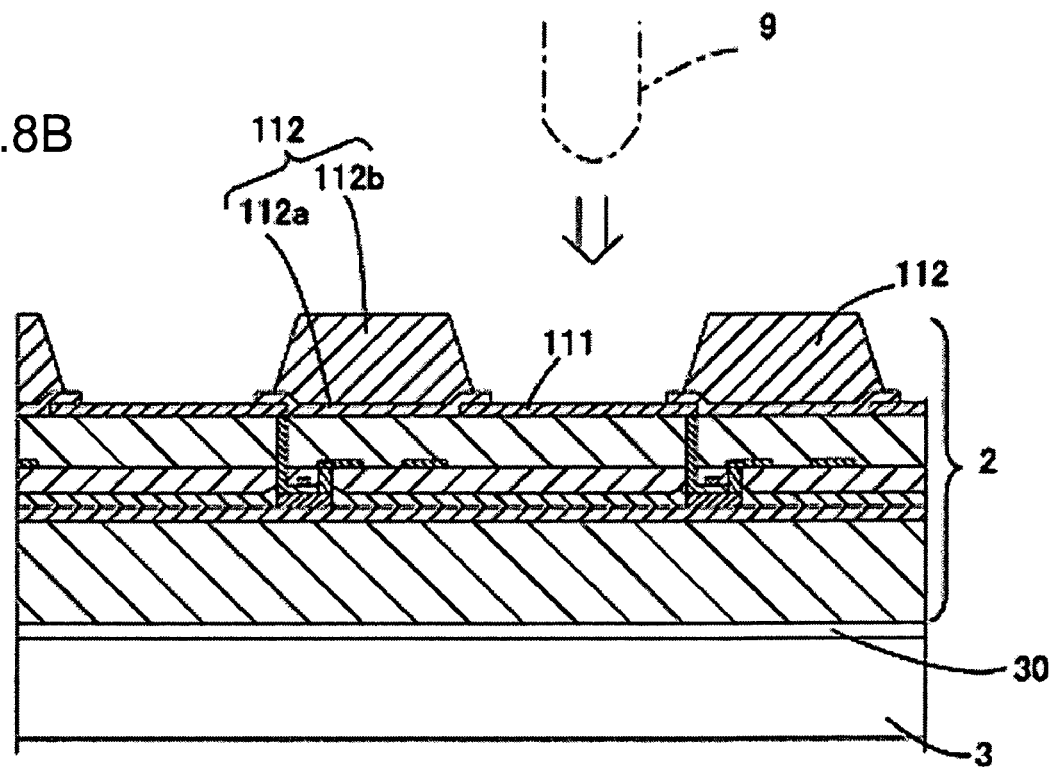

FIGS. 5(A) and 5(B) are explanatory diagrams illustrating a small substrate forming process in a method of manufacturing the organic EL display device according to the present invention. FIGS. 6(A), 6(B), and 6(C) are explanatory diagrams illustrating a state in which a protective film is bonded to the small substrate in the method of manufacturing the organic EL display device according to the present invention. FIGS. 7(A), 7(B), and 7(C) are explanatory diagrams illustrating a bonding process in the method of manufacturing the organic EL display device according to the present invention. FIGS. 8(A) and 8(B) are explanatory diagrams illustrating an organic functional layer forming process in the method of manufacturing the organic EL display device according to the present invention.

In the manufacture of the organic EL display device 1, the small substrate forming process of the present embodiment is a process for forming circuit elements, such as the TFTs 123 and 124, the pixel electrode 111 of the organic EL element 101, and the partition wall 112 on the small substrate 2 as shown in FIGS. 5(A) and 5(B).

Next, after protective films 6 and 7 are respectively bonded to one surface 21 and the one surface 22 of the small substrate 2 (a protective film bonding process), a laser beam is irradiated along a cutting line indicated by an one-dot chain line 201 in FIG. 6(A) to cut the small substrate 2 together with the protective films 6 and 7, and the cut portion is then cleaned (a cutting process by a laser). Then, the cut portion of the small substrate 2 is vertically adjusted with respect to the surface of substrate. In addition, the cutting of the small substrate 2 by the laser is preferably performed on at least two sides of the small substrate 2 adjacent to other small substrates as shown in FIGS. 1(A) and 1(B). Further, alignment marks indicating positions where the laser is irradiated are preferably formed at four corners of the small substrate 2. The protective films 6 and 7 are generally referred to as UV films, and each of them comprises a film substrate 61 or 71, an adhesive layer 63 or 73, and a UV peeling layer 62 or 72 interposed therebetween.

After the bonding process, the protective film 6 is formed below a surface plate 8 having a flat reference surface, and the plurality of small substrates 2 are planarly arranged on the surface plate 8 as shown in FIG. 7(A). Then, a UV ray is irradiated onto the protective film 7 to peel of the protective film 7. Subsequently, the adhesive layer 73 is completely removed from the protective film 7 and a peeling surface is then cleaned. Next, as shown in FIG. 7(B), an adhesive 30, such as acryl resin, is applied on the other surface (the rear surface) 22 of each of the small substrates 2, and the large substrate 3 is superposed on the rear surfaces 22 of the small substrates 2. Then, the adhesive 30 is hardened. At that time, as indicated by arrow F, fluid pressure is applied to the large substrate 3 such that the large substrate 3 presses against the surface plate 8 in order to improve the adhesion between the large substrate 3 and the small substrates 2 and to align the other surface 21 of each of the plurality of small substrates 2. As a result, as shown in FIG. 7(C), the plurality of small substrates 2 is fixed to the large substrate 3 by the adhesive 30. A method of applying fluid pressure to the large substrate 3 includes a method of ejecting compressed air from a head to the large substrate 3 and a method of forming a partition film having elasticity on the large substrate 3 and of supplying a fluid, such as air or liquid, into one of two spaces partitioned by the partition film, in which the one space is opposite to the side where the large substrate 3 is arranged.

Next, as shown in FIGS. 8(A) and 8(B), UV rays are irradiated onto the protective film 6 to peel off the protective film 6, and the peeled surface is then cleaned. After peeling off the protective film 6, the adhesive layer 63 is completely removed.

Subsequently, the light-emitting functional layer forming process is performed by the relative movement between the small substrates 2 and an inkjet head 9 indicated by a one-dot chain line in FIG. 8(B). First, a liquid composition constituting the hole injecting/transporting layer 110a is selectively ejected and applied onto regions on the small substrate 2 surrounded by the partition wall 112, and then a head treatment is performed thereon to form the hole injecting/transporting layer 110a. Similarly, a liquid composition for the light-emitting layer 110b corresponding to a predetermined color is ejected and applied onto the regions on the small substrate 2 surrounded by the partition wall 112 by the relative movement between the inkjet head 9 and the small substrate 2, and a heat treatment is performed thereon to form the light-emitting layer 110b. Examples of the liquid composition for forming the hole injecting/transporting layer 110a include conductive polymers, such as 3,4-polyethylenedioxythiophen/polystyrenesulfonic acid (PEDOT/PSS), polyaniline, and polypyrrole, and solutions or dispersion solutions, such as MTDATA, a phenylamine derivative, and copper phthalocyanine. In addition, examples of the liquid composition for forming the light-emitting layer 110b include solutions or dispersion solutions, such as a (poly) fluorene derivative (PF), a (poly)paraphenylenevinylene derivative (PPV), a polyphenylene derivative (PP), a poly-paraphenylene derivative (PPP), polyvinylcarbazole (PVK), a polythiophene derivative, and a polysilane-based material, such as polymethylphenylsilane (PMPS).

As shown in FIG. 4(B), the calcium layer 12a and the aluminum layer 12b of the cathode 12 are sequentially formed by, for example, vacuum deposition. At that time, in order to selectively form the calcium layer 12a and the aluminum layer 12b in a larger area, the film deposition is performed in a state in which an outer circumferential portion, such as a terminal forming region, is covered with a predetermined member.

Then, the sealing substrate 4 adheres by the sealing resin 40 (a sealing process). In this way, the organic EL display device 1 shown in FIGS. 1(A) and 1(B) is manufactured. In addition, when the sealing substrate 4 having a size larger than a total area of four small substrates 2 is used, the sealing substrate 4 adheres to only the inner region of each of the small substrates 2 other than an outer circumferential portion thereof corresponding to the terminal forming region 20 by the sealing resin 40. Then, the outer circumferential portion of the sealing substrate 4 is cut using a scribing apparatus, and the terminal forming region 20 of the small substrate 2 is exposed.

Main Effects of the Present Embodiment

As described above, in the present embodiment, processes required for a laser annealing technique or a photolithography technique, such as a process of forming the TFTs 123 and 124 and a process of forming the pixel electrodes 111, are performed before the small substrates are bonded to the large substrate 3. In addition, after the bonding process, the light-emitting functional layer 110 of the organic EL element 101 is formed by the inkjet method. Therefore, it is possible to easily apply a liquid material at any position to form a film. Thus, even when the light-emitting functional layer 110 of the organic EL display device 101 is formed in a large area where a plurality of the small substrates 2 are planarly arranged, it is possible to manufacture an organic EL display device using a small-sized manufacturing apparatus and to prevent a decrease in manufacturing yield.

Further, in the present embodiment, before the bonding process, it is possible to form the section of the small substrate 2 at a right angle by cutting the outer circumference of the small substrate 2 using a laser and thus to bond the small substrates 2 of the organic EL display device 1 with high positional accuracy. As a result, even when forming the light-emitting functional layer 110 using the inkjet method, it is possible to form the light-emitting layer 110 on the small substrate 2 at a predetermined position with high accuracy.

Furthermore, in the present embodiment, since the bonding process is performed in a state in which the protective film 6 adheres to the one surface (upper surface) 21 of the small substrate 2, it is possible to prevent the sticking of an extraneous matter or the damage of the TFTs 123 and 124 caused by external force. In addition, since the large substrate 3 is bonded on the basis of the other surface 21 (upper surface) of the small substrate 2, it is possible to uniform a distance from the inkjet head 9 to any one of the plurality of small substrates 2. Therefore, since the falling distance of a liquid droplet from the inkjet head 9 to any small substrate 2 is uniform, it is possible to prevent the deviation of the forming position of the light-emitting functional layer 110 or a variation of the diameter of a liquid droplet landed on the substrate caused by a variation of the falling distance, thereby forming a film with high accuracy.

Moreover, in the process of bonding the large substrate 3 to the small substrates 2, since fluid pressure is applied to the large substrate 3 to press the large substrate 3 against the plate 8, force is uniformly applied to the large substrate 3 and the small substrates 2. Therefore, all small substrates 2 can be bonded in the same condition. Thus, it is possible to the positional deviation of the small substrates 2 in the thickness direction of the organic EL display device 1 and thus to display a high-quality image.

Second Embodiment

Figure 9A:
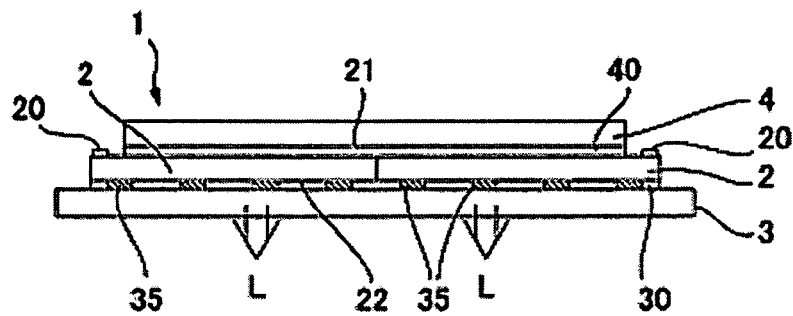
FIG. 9(A) is a plan view of an organic EL display device according to a second embodiment of the present invention.
Figure 9B:
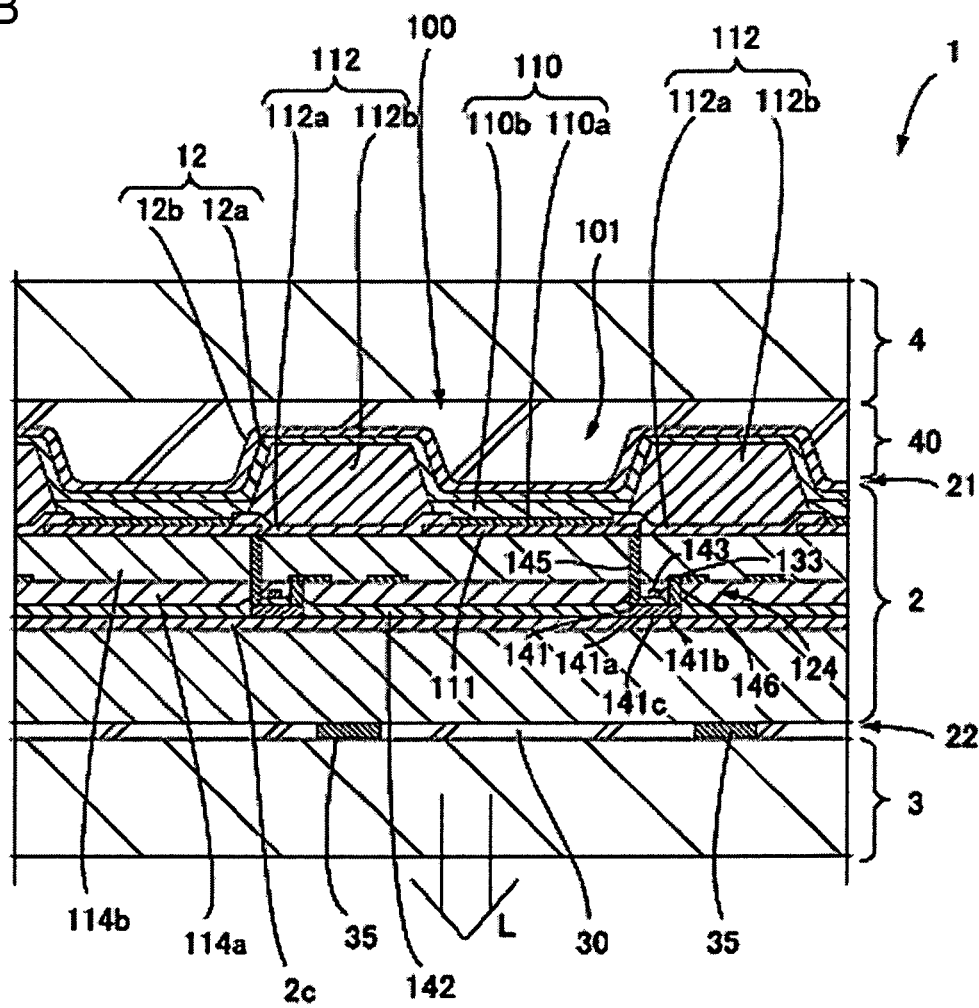
FIG. 9(B) is an enlarged cross-sectional view schematically illustrating the sectional structure of one pixel region in the organic EL display device.

FIG. 9(A) is a cross-sectional view of an organic EL display device according to a second embodiment of the present invention, and FIG. 9(B) is an enlarged cross-sectional view illustrating the sectional structure of one pixel region in the organic EL display device. In addition, the organic EL display device according to the second embodiment has the same basic structure as that in the first embodiment. Therefore, components having the same function as those in the first embodiment are represented by the same reference numerals, and a description thereof will be omitted for simplicity of explanation.

In FIGS. 9(A) and 9(B), similar to the first embodiment, the organic EL display device 1 is a bottom-emission-type, and is used as a large display device having a size larger than 30 inches that is manufactured by a tiling technique. That is, in the organic EL display device 1 according to the present embodiment, in a state in which four small substrates 2 (TFT array substrates) are planarly arranged, one surface (rear surfaces) 22 of the four small substrates 2 are bonded to a large substrate 3 by a transparent adhesive 30. In addition, a sealing substrate 4 is bonded to the other surface (upper surfaces) 21 of the small substrates 2 by a sealing resin 40, such as epoxy resin. An acryl-based adhesive having substantially the same refractive index as that of glass used for the large substrate 3 and the small substrate 2 is used as the adhesive 30. In the present embodiment, the large substrate 3 has a size larger than a total size of a plurality of the small substrates 2. On the other hand, the sealing substrate 4 has a size smaller than the total size of the plurality of small substrates 2, and a portion of the other surface 21 of each of the small substrates 2 protrudes from the edge of the sealing substrate 4. Therefore, it is possible to electrically connect an external circuit, such as a flexible wiring substrate (not shown), to a terminal forming region 20 formed in an end portion of the other surface 21 of the small substrate 2.

In the organic EL display device 1 having the above-mentioned structure, when the positional deviation of the four small substrates 2 in the thickness direction thereof occurs, or when the small substrate 2 is inclined toward the outside of the surface, the deviation of a light-emitting position in each pixel occurs, and the unevenness of brightness occurs, resulting in the deterioration of display quality. Therefore, in the present embodiment, first substrate-gap-controlling members 35 for controlling the gap between the small substrate 2 and the large substrate 3 are formed on a bonding surface between the large substrate 3 and the small substrate 2, and by the bonding process similar to that shown in FIGS. 7(A), 7(B), and 7(C), both the substrates are bonded to each other with the first substrate-gap-controlling members 35 interposed between the large substrate 3 and the small substrates 2.

In the present embodiment, the first substrate-gap-controlling member 35 is a projection formed on the large substrate 3, and such a projection can be made of a pillar-shaped photosensitive resin formed by a photolithography technique. An acryl resin is generally used as the photosensitive resin. In addition, the first substrate-gap-controlling member 35 may be a resin composition fixed on the large substrate 3 by a transferring method, a printing method, or an inkjet method. In this case, when a composition obtained by dispersing a granular or rod-shaped gap material in resin is used as the resin composition, it is possible to form the first substrate-gap-controlling member 35 having a predetermined height. Further, when a composition obtained by dispersing a granular or rod-shaped gap material in a quick-drying resin is used as the resin composition, it is possible to from the first substrate-gap-controlling member 35 having a-large height with high accuracy since the resin does not flow on the large substrate 3.

Further, the first substrate-gap-controlling members 35 can be selectively formed at predetermined positions on the large substrate 3 by any one of the above-mentioned methods. Therefore, in the present embodiment, the first substrate-gap-controlling members 35 are formed in regions other than the region overlapping the forming region of the organic EL element 101 in plan view, that is, in regions overlapping the partition wall 112 or various wiring lines (the scanning lines 131, the signal lines 132, and the power lines 133 shown in FIG. 3) in plan view. The other structures of the present embodiment are similar to those of the first embodiment, and thus a description thereof will be omitted for simplicity of explanation.

As described above, according to the present embodiment, in the bonding process, the small substrates 2 and the large substrate 3 are bonded to each other, with the first substrate-gap-controlling member 35 for controlling the gap between the substrates interposed between the small substrates 2 and the large substrate 3. Therefore, since the gap between the large substrate 3 and the small substrates 2 is accurately defined by the first substrate-gap-controlling members 35, the variation of gap in the thickness direction of the small substrate 2 does not occur, and the small substrate 2 is not inclined toward the outside of the surface. Thus, in the case of a bottom-emission-type display device in which display light is emitted from the large substrate 3, it is possible to accurately align the light-emitting position of each pixel. As a result, the distortion of an image does not occur, and thus it is possible to provide a display device having high display quality.

Further, according to the present embodiment, the first substrate-gap-controlling members 35 are formed in regions other than the region overlapping the forming region of the organic EL element 101 in plan view. Therefore, in the bottom-emission-type organic EL display device 1 according to the present invention, even when the first substrate-gap-controlling members 35 are interposed between the small substrates 2 and the large substrate 3, display light is not shielded. Thus, it is possible to prevent the deterioration of display quality.

Furthermore, according to the present embodiment, the first substrate-gap-controlling members 35 are formed on the large substrate 3. However, the first substrate-gap-controlling members 35 may be formed on the small substrates 2. In addition, even when the organic EL display device 1 is a bottom-emission-type, the first substrate-gap-controlling member 35 may be formed in the region overlapping the forming region of the organic EL element 101 in plan view if the refractive index of the first substrate-gap-controlling member 35 is substantially equal to those of the adhesive 30, the large substrate 3, and the small substrates 2.

Moreover, according to the present embodiment, the positional deviation of the small substrates 2 with respect to the large substrate 3 in the thickness direction of the small substrate 2 does not occur, and the small substrate 2 is not inclined toward the surface. Therefore, when the present invention is applied to a bottom-emission-type or top-emission-type organic EL display device 1, the falling distance of a liquid droplet from the inkjet head 9 to all small substrates 2 is uniform, and thus it is possible to prevent the deviation of the forming position of the light-emitting functional layer 110 or a variation in the diameter of a liquid droplet landed on the substrate caused by a variation in the falling distance. Therefore, it is possible to display a high-quality image without the unevenness of brightness.

Third Embodiment

Figure 10A:
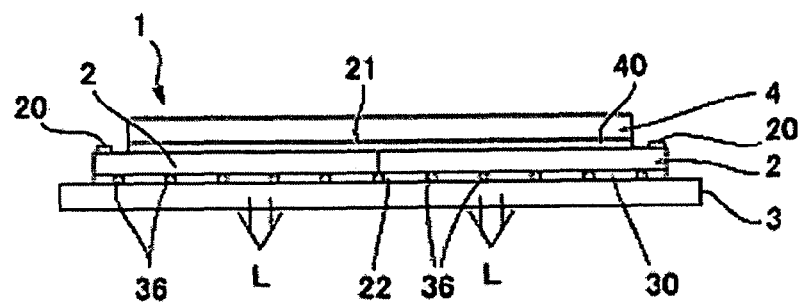
FIG. 10(A) is a plan view of an organic EL display device according to a third embodiment of the present invention.
Figure 10B:
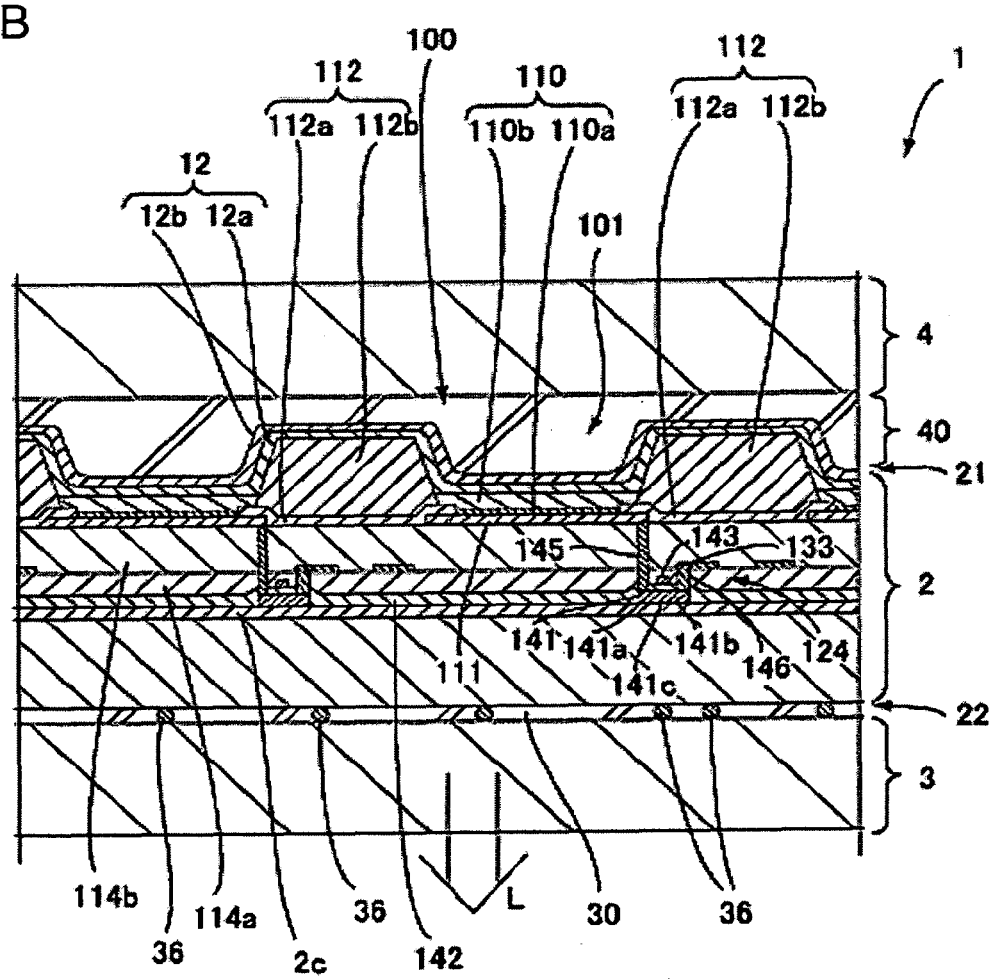
FIG. 10(B) is an enlarged cross-sectional view schematically illustrating the sectional structure of one pixel region in the organic EL display device.

FIG. 10(A) is a cross-sectional view of an organic EL display device according to a third embodiment of the present invention, and FIG. 10(B) is an enlarged cross-sectional view illustrating the sectional structure of one pixel region in the organic EL display device. In addition, the organic EL display device according to the third embodiment has the same basic structure as that in the first embodiment. Therefore, components having the same function as those in the first embodiment are represented by the same reference numerals, and a description thereof will be omitted for simplicity of explanation.

In FIGS. 10(A) and 10(B), similar to the first embodiment, the organic EL display device 1 according to the present embodiment is a bottom-emission-type and is used as a large display device having a size larger than 30 inches that is manufactured by a tiling technique. That is, in the organic EL display device 1 according to the present embodiment, in a state in which four small substrates 2 (TFT array substrates) are planarly arranged, one surface (rear surfaces) 22 of the four small substrates 2 are bonded to a large substrate 3 by a transparent adhesive 30. In addition, a sealing substrate 4 is bonded to the other surface (upper surfaces) 21 of the small substrates 2 by a sealing resin 40, such as epoxy resin. An acryl-based adhesive having substantially the same refractive index as that of glass used for the large substrate 3 and the small substrate 2 is used as the adhesive 30. In the present embodiment, the large substrate 3 has a size larger than a total size of the plurality of small substrates 2. On the other hand, the sealing substrate 4 has a size smaller than the total size of the plurality of small substrates 2, and a portion of the other surface 21 of each of the small substrates 2 protrudes from the edge of the sealing substrate 4. Therefore, it is possible to electrically connect an external circuit, such as a flexible wiring substrate (not shown), to a terminal forming region 20 formed in an end portion of the other surface 21 of the small substrate 2.

In the organic EL display device 1 having the above-mentioned structure, according to the present embodiment, the small substrates 2 and the large substrate 3 are bonded to each other, with first substrate-gap-controlling members 36 for controlling the gap between the substrate, interposed between the small substrates 2 and the large substrate 3 interposed therebetween, in the bonding process similar to that shown in FIGS. 7(A), 7(B), and 7(C).

In the present embodiment, the first substrate-gap-controlling members 36 granular or rod-shaped gap materials arranged between the small substrates 2 and the large substrate 3. When the first substrate-gap-controlling members 36 made of such a gap material are interposed between the small substrates 2 and the large substrate 3, the gap material may be previously dispersed in the adhesive 30. In addition, the first substrate-gap-controlling members 36 made of the gap material may be scattered on the four small substrates 2 arranged as shown in FIG. 7(B), and the adhesive 30 may be applied on a surface of the large substrate 3. Then, the small substrates 2 and the large substrate 3 may be bonded to each other.

Since it is impossible to control the position of the gap material, serving as the first substrate-gap-controlling member 36, an optical material having substantially the refractive index as those of the adhesive 30, the large substrate 3, and the small substrates 2 is used as the gap material. Since the other structures of the present embodiment are similar to those of the first embodiment, a description thereof will be omitted for simplicity of explanation.

As described above, according to the present embodiment, in the bonding process, the small substrates 2 and the large substrate 3 are bonded to each other, with the first substrate-gap-controlling member 36 for controlling the gap between the substrates interposed between the small substrates 2 and the large substrate 3. Therefore, since the positional relation of the small substrate 2 with respect to the surface of the large substrate 3 is accurately defined by the first substrate-gap-controlling members 36, the variation of gap in the thickness direction of the small substrate 2 does not occur, and the small substrate 2 is not inclined toward the outside of the surface. Thus, in the case of a bottom-emission-type display device in which display light is emitted from the large substrate 3, it is possible to accurately align the light-emitting position of each pixel. As a result, the distortion of an image does not occur, and thus it is possible to provide a display device having high display quality.

Further, an optical material having substantially the same refractive index as those of the adhesive 30, the large substrate 3, and the small substrates 2 is used as the gap material used in the present embodiment. Therefore, in the bottom-emission-type organic EL display device 1, even when the gap material is interposed between the small substrates 2 and the large substrate 3, the deterioration of display quality does not occur.

Furthermore, according to the present embodiment, the positional deviation of the small substrates 2 with respect to the large substrate 3 in the thickness direction of the small substrate 2 does not occur, and the small substrate 2 is not inclined toward the surface. Therefore, the falling distance of a liquid droplet from the inkjet head 9 to all small substrates 2 is uniform, and thus it is possible to prevent the deviation of the forming position of the light-emitting functional layer 110 or a variation in the diameter of a liquid droplet landed on the substrate caused by a variation in the falling distance. Thus, it is possible to display a high-quality image without the unevenness of brightness.

Further, in the present embodiment, the gap material is scattered on four small substrates 2, and the adhesive 30 is applied on the large substrate 3. However, on the contrary, the gap material may be scattered on the large substrate 3, and the adhesive 30 may be applied on the four small substrates 2. Then, the small substrates 2 and the large substrate 3 may be bonded to each other.

Furthermore, when the organic EL display device 1 is a top-emission-type, a gap material having a different refractive index from those of the adhesive 30, the large substrate 3, and the small substrates 2 may be used as the first substrate-gap-controlling member 36.

Fourth Embodiment

Figure 11A:
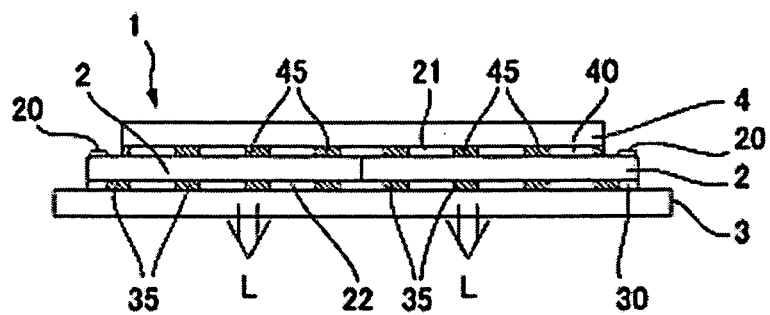
FIG. 11(A) is a plan view of an organic EL display device according to a fourth embodiment of the present invention.
Figure 11B:
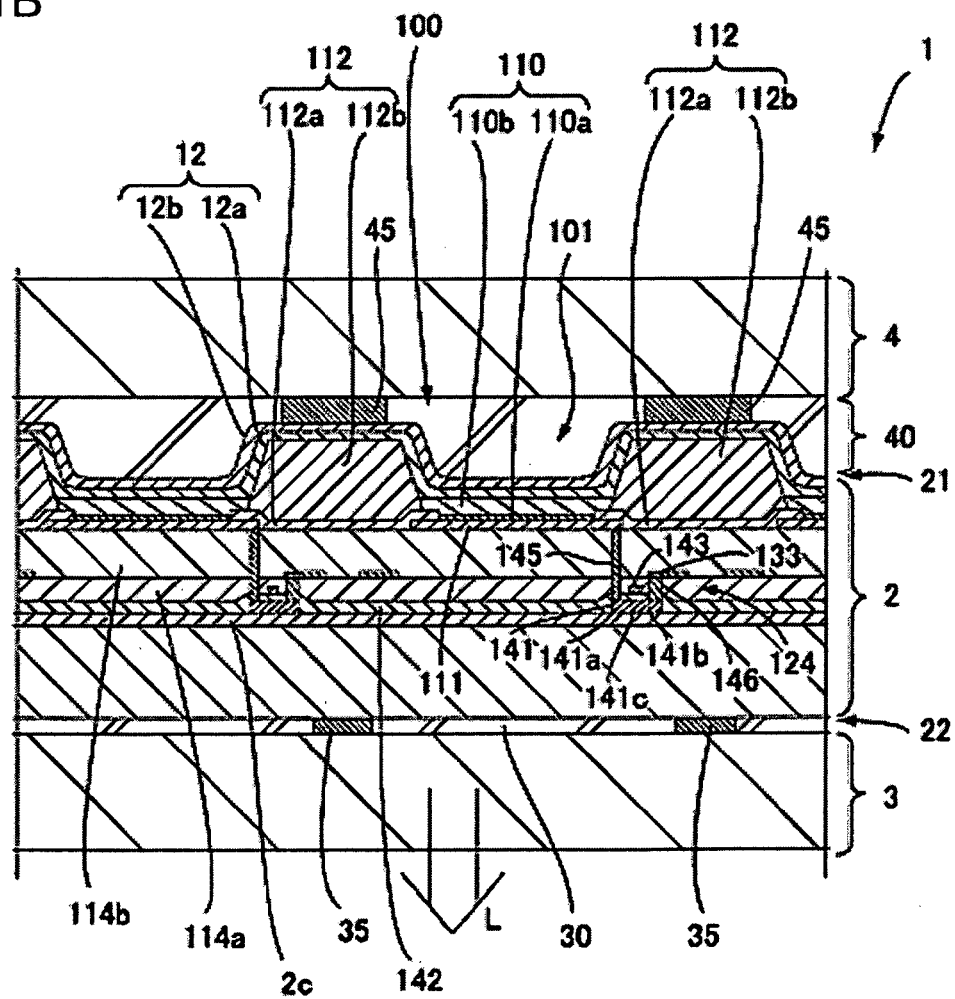
FIG. 11(B) is an enlarged cross-sectional view schematically illustrating the sectional structure of one pixel region in the organic EL display device.

FIG. 11(A) is a cross-sectional view of an organic EL display device according to a fourth embodiment of the present invention, and FIG. 11(B) is an enlarged cross-sectional view illustrating the sectional structure of one pixel region in the organic EL display device. In addition, the organic EL display device according to the fourth embodiment has the same basic structure as that in the first embodiment. Therefore, components having the same function as those in the first embodiment are represented by the same reference numerals, and a description thereof will be omitted for simplicity of explanation.

In FIGS. 11(A) and 11(B), similar to the first embodiment, the organic EL display device 1 according to the present embodiment is a bottom-emission-type and is used as a large display device having a size larger than 30 inches that is manufactured by a tiling technique. That is, in the organic EL display device 1 according to the present embodiment, in a state in which four small substrates 2 (TFT array substrates) are planarly arranged, one surface (rear surfaces) 22 of the four small substrates 2 are bonded to a large substrate 3 by a transparent adhesive 30. In addition, a sealing substrate 4 is bonded to the other surface (upper surfaces) 21 of the small substrates 2 by a sealing resin 40, such as epoxy resin. An acryl-based adhesive having substantially the same refractive index as that of glass used for the large substrate 3 and the small substrates 2 is used as the adhesive 30. In the present embodiment, the large substrate 3 has a size larger than a total size of the plurality of small substrates 2. On the other hand, the sealing substrate 4 has a size smaller than the total size of the plurality of small substrates 2, and a portion of the other surface 21 of each of the small substrates 2 protrudes from the edge of the sealing substrate 4. Therefore, it is possible to electrically connect an external circuit, such as a flexible wiring substrate (not shown), to a terminal forming region 20 formed in an end portion of the other surface 21 of the small substrate 2.

In the organic EL display device 1 according to the present embodiment, similar to the second embodiment, first substrate-gap-controlling members 35 for controlling the gap between the small substrates 2 and the large substrate 3 are formed on a bonding surface between the small substrates 2 and the large substrate 3. In the bonding process shown in FIGS. 7(A), 7(B), and 7(C), the small substrates 2 and the large substrate 3 are bonded to each other with the first substrate-gap-controlling members 35 interposed therebetween. The first substrate-gap-controlling member 35 is a projection formed on the large substrate 3 or the small substrates 2, and such a projection can be made of a pillar-shaped photosensitive resin formed by a photolithography technique. In addition, the first substrate-gap-controlling member 35 may be a resin composition fixed on the large substrate 3 by a transferring method, a printing method, or an inkjet method.

In the present embodiment, second substrate-gap-controlling members 45 for controlling the gap between the small substrates 2 and the sealing substrate 4 are formed on a bonding surface between the sealing substrate 4 and the small substrates 2, and the small substrates 2 and the sealing substrate 4 are bonded to each other by using a sealing resin 40 such as an epoxy resin with the second substrate-gap-controlling members 45 interposed therebetween.

In the present embodiment, the second substrate-gap-controlling member 45 is a projection formed on the sealing substrate 4, and such a projection can be made of a pillar-shaped photosensitive resin formed by a photolithography technique. In addition, the second substrate-gap-controlling member 45 may be a resin composition fixed on the sealing substrate 4 by a transferring method, a printing method, or an inkjet method. In this case, when a composition obtained by dispersing a granular or rod-shaped gap material in resin is used as the resin composition, it is possible to form the second substrate-gap-controlling members 45 having a predetermined height. Further, when a composition obtained by dispersing a granular or rod-shaped gap material in a quick-drying resin is used as the resin composition, it is possible to from the second substrate-gap-controlling members 45 having a large height with high accuracy since the resin does not flow on the sealing substrate 4.

Further, the second substrate-gap-controlling members 45 can be selectively formed at predetermined positions on the sealing substrate 4 by any one of the above-mentioned methods. Therefore, in the present embodiment, the second substrate-gap-controlling members 45 are formed in regions other than the region overlapping the forming region of the organic EL element 101 in plan view, that is, in regions overlapping the partition wall 112 or various wiring lines (the scanning lines 131, the signal lines 132, and the power lines 133 shown in FIG. 3). The other structures of the present embodiment are similar to those of the first embodiment, and thus a description thereof will be omitted for simplicity of explanation.

As described above, according to the present embodiment, in the bonding process, the small substrates 2 and the large substrate 3 are bonded to each other, with the first substrate-gap-controlling members 35 for controlling the gap between the substrates interposed between the small substrates 2 and the large substrate 3. Therefore, since the positional relation of the small substrate 2 with respect to the surface of the large substrate 3 is accurately defined by the first substrate-gap-controlling members 35, the variation of gap in the thickness direction of the small substrate 2 does not occur, and the small substrate 2 is not inclined toward the outside of the surface. Thus, in the case of a bottom-emission-type display device in which display light is emitted from the large substrate 3, it is possible to accurately align the light-emitting position of each pixel. As a result, image distortion does not occur, and thus it is possible to provide a display device having high display quality.

Further, according to the present embodiment, a variation in the gap of the small substrates 2 with respect to the large substrate 3 in the thickness direction of the small substrate 2 does not occur, and the small substrate 2 is not inclined toward the outside of the surface. Therefore, even when the structure of the present invention is applied to a bottom-emission-type or top-emission-type organic EL display device 1, the falling distance of a liquid droplet from the inkjet head 9 to all small substrates 2 is uniform, and thus it is possible to prevent the deviation of the forming position of the light-emitting functional layer 110 or a variation in the diameter of a liquid droplet landed on the substrate caused by a variation in the falling distance. Thus, it is possible to display a high-quality image without the unevenness of brightness, which is the same effect as that in the second embodiment.

Furthermore, when the structure of the present invention is applied to the top-emission-type organic EL display device 1, the small substrates 2 and the sealing substrate 4 are bonded to each other with the second substrate-gap-controlling members 45 interposed therebetween. Therefore, the four small substrates 2 are bonded to the sealing substrate 4 with high positional accuracy. Thus, since the light-emitting position of each pixel can be accurately aligned, it is possible to improve display quality. Further, the second substrate-gap-controlling members 45 are formed in regions other than the region overlapping the forming region of the organic EL element 101 in plan view. Therefore, in the top-emission-type organic EL display device 1, even when the second substrate-gap-controlling members 45 are interposed between the small substrates 2 and the sealing substrate 4, display light is not shielded. As a result, it is possible to prevent the deterioration of display quality.

Moreover, when an end portion of the sealing substrate 4 is cut using a scribing apparatus such that the terminal regions of the small substrates 2 are exposed, the small substrates 2 and the sealing substrate 4 are bonded to each other with high positional accuracy. Therefore, it is possible to accurately cut the sealing substrate 4.

Further, according to the present embodiment, the second substrate-gap-controlling members 45 are formed in regions other than the region overlapping the forming region of the organic EL element 101 in plan view. Therefore, even when the second substrate-gap-controlling members 45 are interposed between the small substrates 2 and the sealing substrate 4, stress from the sealing substrate 4 is not applied to the organic EL elements 101 through the second substrate-gap-controlling members 45. Thus, the organic EL elements 101 are not damaged, thereby improving the reliability of the organic EL display device 1.

Furthermore, in the present embodiment, similar to the second embodiment, the first substrate-gap-controlling members 35 having a projection shape are interposed between the small substrates 2 and the large substrate 3. However, as described in the third embodiment, the first substrate-gap-controlling members 36 composed of a granular or rod-shaped gap material may be interposed therebetween.

Fifth Embodiment

Figure 12A:
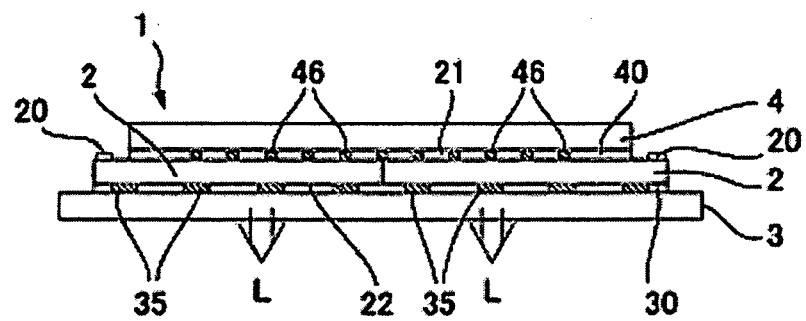
FIG. 12(A) is a plan view of an organic EL display device according to a fifth embodiment of the present invention.
Figure 12B:
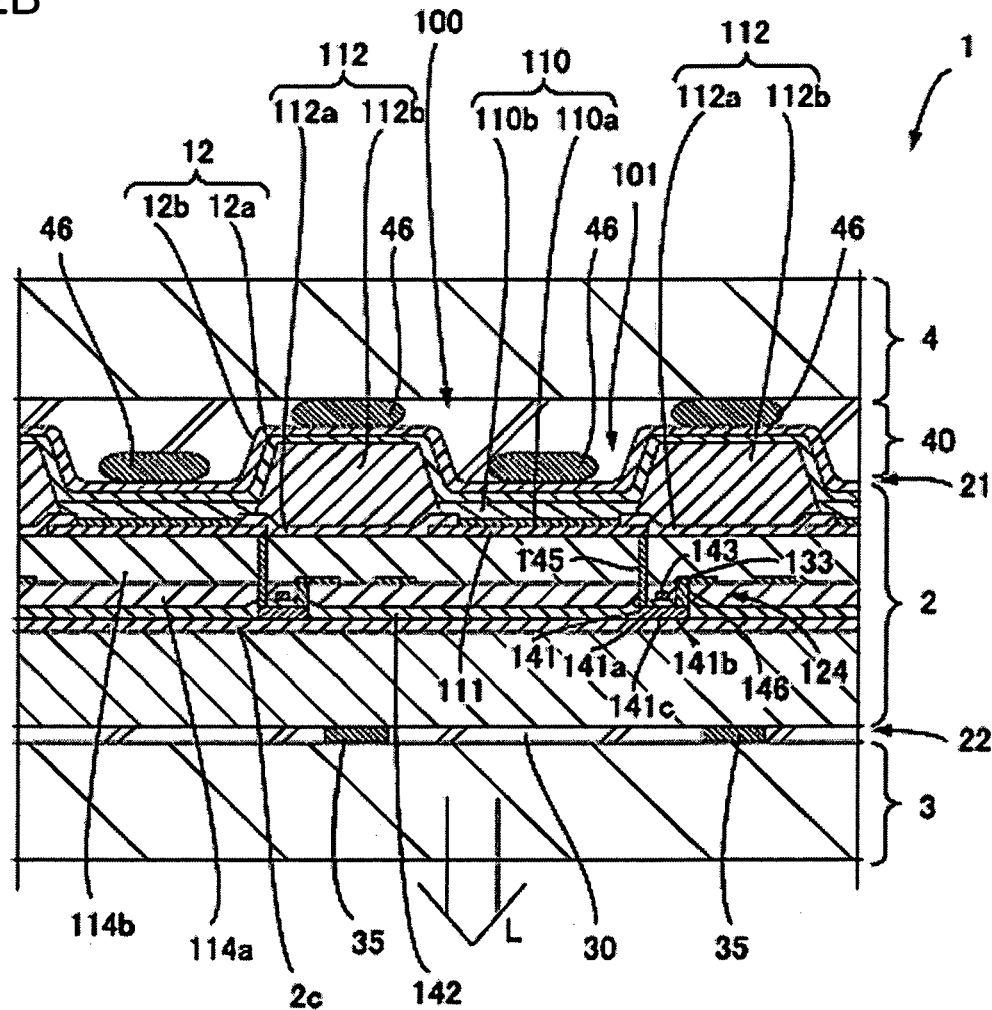
FIG. 12(B) is an enlarged cross-sectional view schematically illustrating the sectional structure of one pixel region in the organic EL display device.

FIG. 12(A) is a cross-sectional view of an organic EL display device according to a fifth embodiment of the present invention, and FIG. 12(B) is an enlarged cross-sectional view illustrating the sectional structure of one pixel region in the organic EL display device. In addition, the organic EL display device according to the fifth embodiment has the same basic structure as that in the first embodiment. Therefore, components having the same function as those in the first embodiment are represented by the same reference numerals, and a description thereof will be omitted for simplicity of explanation.

In FIGS. 12(A) and 12(B), similar to the first embodiment, the organic EL display device 1 according to the present embodiment is a bottom-emission-type and is used as a large display device having a size larger than 30 inches that is manufactured by a tiling technique. That is, in the organic EL display device 1 according to the present embodiment, in a state in which four small substrates 2 (TFT array substrates) are planarly arranged, one surface (rear surfaces) 22 of the four small substrates 2 are bonded to a large substrate 3 by a transparent adhesive 30. In addition, a sealing substrate 4 is bonded to the other surface (upper surfaces) 21 of the small substrates 2 by a sealing resin 40, such as epoxy resin. An acryl-based adhesive having substantially the same refractive index as that of glass used for the large substrate 3 and the small substrates 2 is used as the adhesive 30. In the present embodiment, the large substrate 3 has a size larger than a total size of the plurality of small substrates 2. On the other hand, the sealing substrate 4 has a size smaller than the total size of the plurality of small substrates 2, and a portion of one surface 21 of each of the small substrates 2 protrudes from the edge of the sealing substrate 4. Therefore, it is possible to electrically connect an external circuit, such as a flexible wiring substrate (not shown), to a terminal forming region 20 formed in an end portion of the other surface 21 of the small substrate 2.

In the organic EL display device 1 according to the present embodiment, similar to the second embodiment, first substrate-gap-controlling members 35 for controlling the gap between the small substrates 2 and the large substrate 3 are formed on a bonding surface of the small substrates 2 and the large substrate 3. In the bonding process similar to that shown in FIGS. 7(A), 7(B), and 7(C), the small substrates 2 and the large substrate 3 are bonded to each other with the first substrate-gap-controlling members 35 interposed therebetween. The first substrate-gap-controlling member 35 is a projection formed on the large substrate 3, and such a projection can be made of a pillar-shaped photosensitive resin formed by a photolithography technique. In addition, the first substrate-gap-controlling member 35 may be a resin composition fixed on the large substrate 3 by a transferring method, a printing method, or an inkjet method.

Further, in the present embodiment, second substrate-gap-controlling members 46 for controlling the gap between the small substrates 2 and the sealing substrate 4 are interposed therebetween, and the small substrates 2 and the sealing substrate 4 are bonded to each other by a sealing resin 40, such as epoxy resin, with the second substrate-gap-controlling members 46 interposed therebetween.

In the present embodiment, the second substrate-gap-controlling members 46 are a granular or rod-shaped gap material arranged between the small substrates 2 and the sealing substrate 4. A method of dispersing the gap material in the sealing resin 40 is used to interpose the second substrate-gap-controlling members 46 made of the gap material between the small substrates 2 and the sealing substrate 4. In a sealing process for bonding the sealing substrate 4, the gap material may be scattered on the four small substrates 2, and the sealing resin 40 may be applied to the sealing substrate 4. Then, the small substrates 2 and the sealing substrate 4 may be bonded to each other. On the contrary, the sealing substrate 4 on which the gap material is applied and the small substrates 2 on which the sealing resin is applied may be bonded to each other. The other structures of the present embodiment are similar to those of the first embodiment, and thus a description thereof will be omitted for simplicity of explanation.

As described above, according to the present embodiment, in the bonding process, the small substrates 2 and the large substrate 3 are bonded to each other, with the first substrate-gap-controlling members 35 for controlling the gap between the substrates interposed between the small substrates 2 and the large substrate 3, similar to the second embodiment. Therefore, since the positional relation of the small substrate 2 with respect to the surface of the large substrate 3 is accurately defined by the first substrate-gap-controlling members 35, the variation of gap in the thickness direction of the small substrate 2 does not occur, and the small substrate 2 is not inclined toward the outside of the surface. Thus, in the case of a bottom-emission-type display device in which display light is emitted from the large substrate 3, it is possible to accurately align the light-emitting position of each pixel. As a result, image distortion does not occur, and thus it is possible to provide a display device having high display quality.

Further, according to the present embodiment, the positional deviation of the small substrates 2 with respect to the large substrate 3 in the thickness direction of the small substrate 2 does not occur, and the small substrate 2 is not inclined toward the outside of the surface. Therefore, even when the structure of the present invention is applied to a bottom-emission-type or top-emission-type organic EL display device 1, the falling distance of a liquid droplet from the inkjet head 9 to all small substrates 2 is uniform, and thus it is possible to prevent the deviation of the forming position of the light-emitting functional layer 110 or a variation in the diameter of a liquid droplet landed on the substrate caused by a variation in the falling distance. Thus, it is possible to display a high-quality image without the unevenness of brightness, which is the same effect as that in the second embodiment.

Furthermore, when the structure of the present invention is applied to the top-emission-type organic EL display device 1, the small substrates 2 and the sealing substrate 4 are bonded to each other with the second substrate-gap-controlling members 46 interposed therebetween. Therefore, the four small substrates 2 are bonded to the sealing substrate 4 with high positional accuracy. Thus, since the light-emitting position of each pixel can be accurately aligned, it is possible to obtain a high-quality image without image distortion. However, in controlling the gap between the substrates using the gap material, it is impossible to accurately control the light-emitting position. In this case, when a gap material having substantially the same refractive index as those of the sealing resin 40, the sealing substrate 4, and the small substrates 2 is used, it is possible to prevent the deterioration of display quality caused by the gap material.

Moreover, when an end portion of the sealing substrate 4 is cut using a scribing apparatus such that the terminal regions of the small substrates 2 are exposed, the small substrates 2 and the sealing substrate 4 are bonded to each other with high positional accuracy. Therefore, it is possible to accurately cut the sealing substrate 4.

Further, in the present embodiment, similar to the second embodiment, the first substrate-gap-controlling members 35 having a projection shape are interposed between the small substrates 2 and the large substrate 3. However, the first substrate-gap-controlling members 36 having a granular shape or a bar shape as described in the third embodiment may be interposed therebetween.

Sixth Embodiment

Figure 13A:
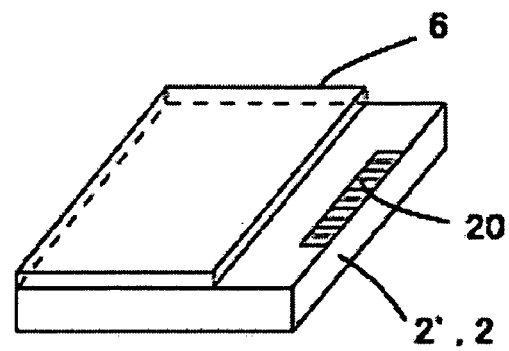
FIG. 13(A) is a perspective view of a small substrate according to a sixth embodiment of the present invention.
Figure 13B:
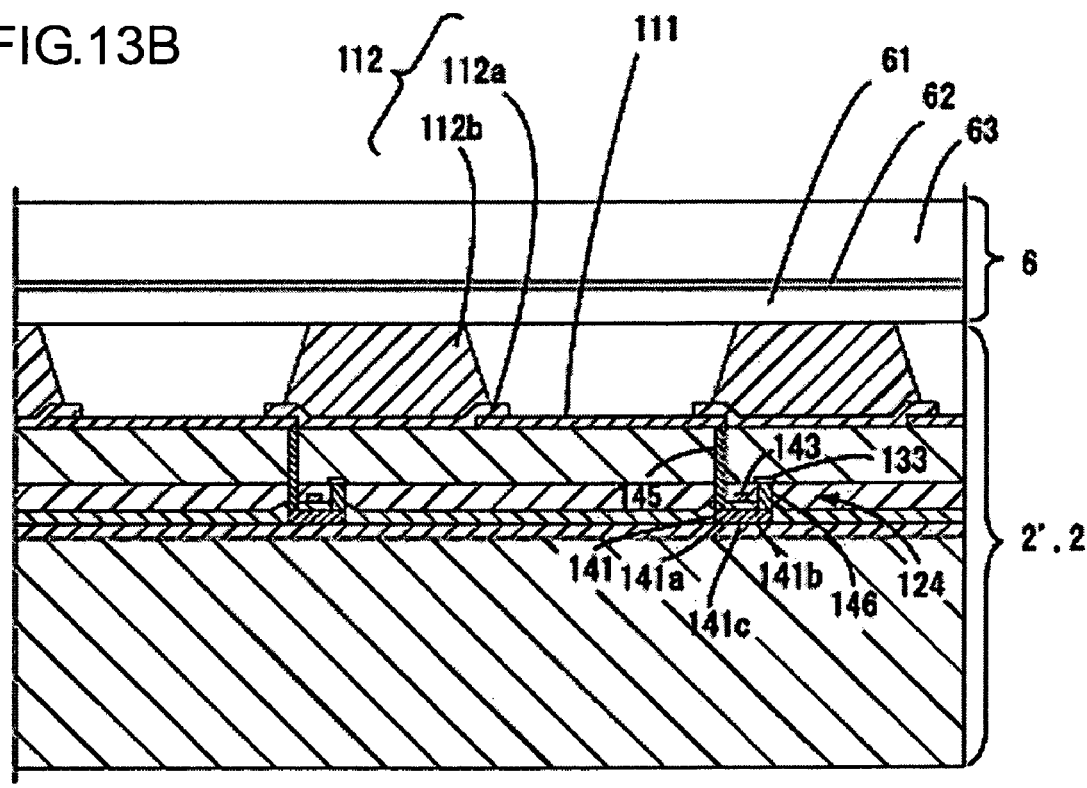
FIG. 13(B) is an enlarged cross-sectional view schematically illustrating the sectional structure of one pixel region.

FIGS. 13(A) and 13(B) are explanatory diagrams illustrating a state in which the manufacture of a small substrate is completed using a method of manufacturing an organic EL display device according to a sixth embodiment of the present invention. FIGS. 14(A) to 14(D) and FIGS. 15(A) to 15(F) are cross-sectional views illustrating the method of manufacturing the organic EL display device shown in FIG. 1. In addition, the organic EL display device according to the present embodiment has the same basic structure as that in the first embodiment. Therefore, components having the same function as those in the first embodiment are represented by the same reference numerals, and a description thereof will be omitted for simplicity of explanation.

In manufacturing an organic EL display device 1, according to the present embodiment, as shown in FIGS. 13(A) and 13(B), circuit elements, such as TFTs 123 and 124, a pixel electrode 111 of an organic EL element 101, a partition wall 112, etc., are formed on a small substrate 2. In this process, the electro-optical device substrate 2 is a thick glass substrate 2' which is not subjected to a thinning process and has a thickness of, for example, 0.5 mm.

Figure 14A:
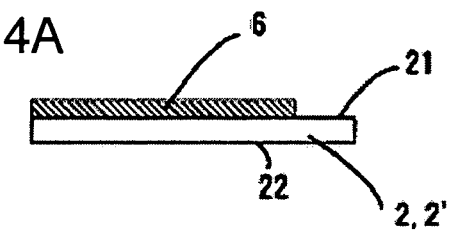
FIGS. 14(A), 14(B), 14(C), and 14(D) are cross-sectional views illustrating a polishing process in a substrate thinning process according to the present invention.
Figure 14B:
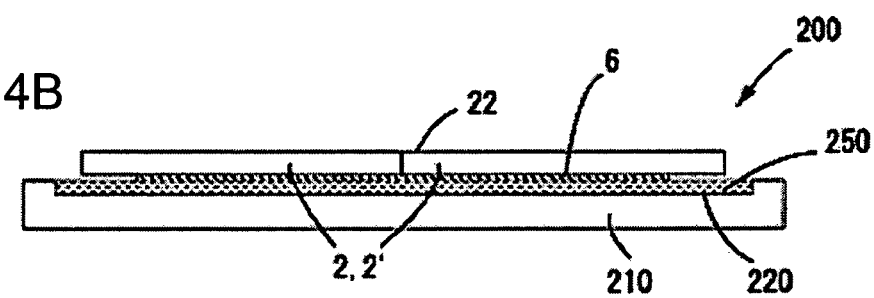

Next, as shown in FIGS. 13(A), 13(B), and 14(A), a protective film 6 adheres to one surface 21 of the small substrate 2 (a protective film adhering process). The protective film 6 is generally called a UV film, and as shown in FIG. 13(B), a UV peeling layer 62 is interposed between a film substrate 61 and an adhesive layer 63. The protective layer 6 may adhere to a portion of the other surface 21 of the small substrate 2 in which terminals 20 are not formed, or may cover the entire surface of the small substrate 2. In addition, it is preferable that a laser beam be irradiated to cut the small substrate 2 together with the protective film 6, thereby adjusting the outward appearance of the substrate. The cutting of the small substrate 2 by the laser is performed on at least two sides of the substrate adjacent to other small substrates 2 in a state in which the substrates are arranged as shown in FIGS. 1(A) and 1(B). Further, alignment marks indicating positions where the laser beam is irradiated are preferably formed at four corners of the substrate 2. When the laser cutting is performed, the small substrates 2 are bonded to each other with high positional accuracy in a state in which the organic EL display device 1 is assembled. In addition, it is possible to prevent the generation of chips in a polishing process, which will be described later.

Figure 14C:
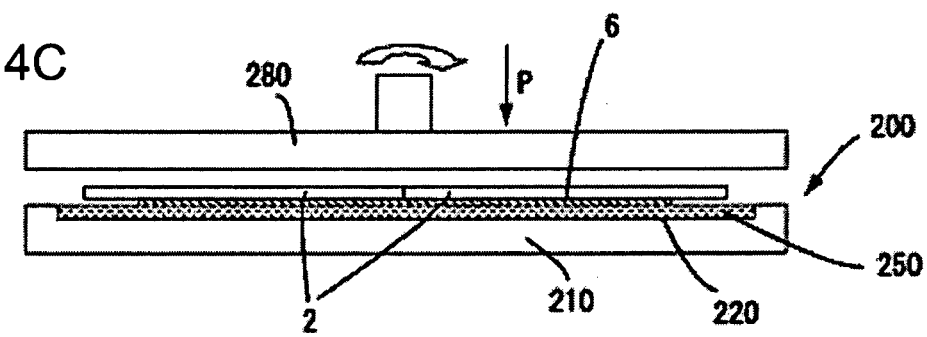

Next, the small substrate 2 is thinned down by a polishing apparatus 200 shown in FIG. 14(C). In this case, first, a plurality of the substrates 2 is fixed on a surface plate 210 (a fixing process) of the polishing apparatus 200 at a regular interval. The polishing apparatus 200 includes the surface plate 210 made of ceramic having a concave portion 220 in which a substrate to be polished is arranged, and the concave portion 220 is filled with wax 250. Therefore, after indirectly heating the wax 250 through the surface plate or directly heating it up to a temperature of 80° C. to melt the wax, the plurality of substrate 2 is arranged in a plane such that one surface 21 of each of the substrates faces the surface of the melted wax 250. Then, fluid pressure is applied to the arranged substrates 2 to press the concave portion 220. In this case, as a method of applying the fluid pressure, the following methods can be used: a method of ejecting compressed air from a head toward the substrates 2; and a method of forming a partition film having elasticity on the substrate 2 and of supplying a fluid, such as air or liquid, into one of two spaces partitioned by the partition film, in which the one space is opposite to the side where the substrate 2 is arranged. In this way, it is possible to apply uniform force to the respective small substrates 2.

Subsequently, the melted wax 250 is naturally or forcibly cooled down to a temperature of 25° C. to be solidified. Then, as shown in FIG. 14(C), the substrate 2 is fixed in the concave portion 220 of the surface plate 210 by the wax 250 with the one surface 22 upward.

Next, the substrates are thinned down. In the thinning process, a polishing head 280 arranged above the substrate 2 is rotated on its axial line, and at the same time, the surface plate 210 is rotated at a speed different from the rotation speed of the head 280. In addition, a suspension consisting of whetstone grains is supplied between the polishing head 280 and the substrate 2, and at the same time, a load of about 150 g/cm$^2$ is applied in the direction of arrow P. Then, the surface of the substrate 2 is polished at a speed of about 7.2 μm/min, so that the substrate 2 is thinned down from 0.5 mm, which is an initial thickness, to 25 μm (a rubbing process).

Figure 14D:
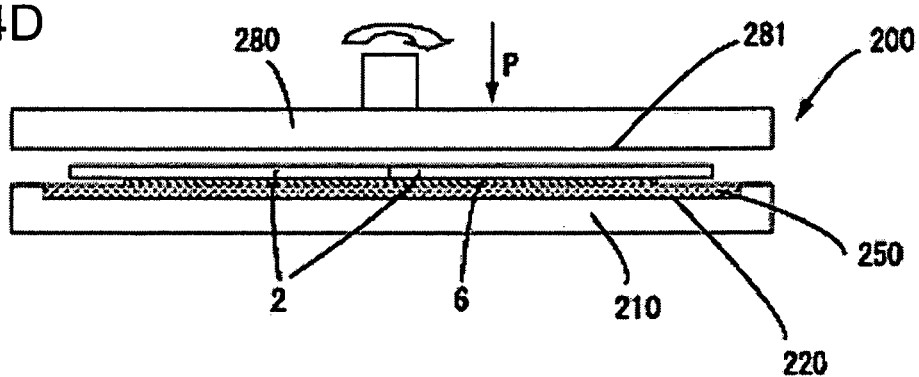

Next, as shown in FIG. 14(D), a polishing process is performed as follows. A soft abrasive cloth 281 is attached on the lower side of the polishing head 280, and the suspension consisting of whetstone grains is supplied between the polishing head 280 and the substrates 2 if necessary. At the same time, a load of about 50 g/cm$^2$ is applied in the direction of arrow P to flatten the rubbed surface. In this way, the small substrate 2 can have transmittance equal to that of glass.

Figure 15A:
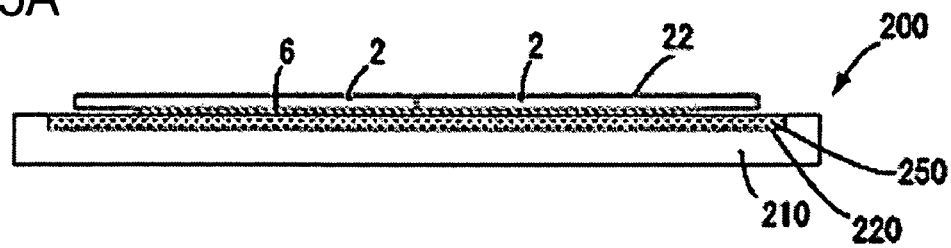
FIGS. 15(A) to 15(F) are cross-sectional views illustrating a bonding process after the substrate thinning process in the method of manufacturing the organic EL display device according to the present invention.
Figure 15B:
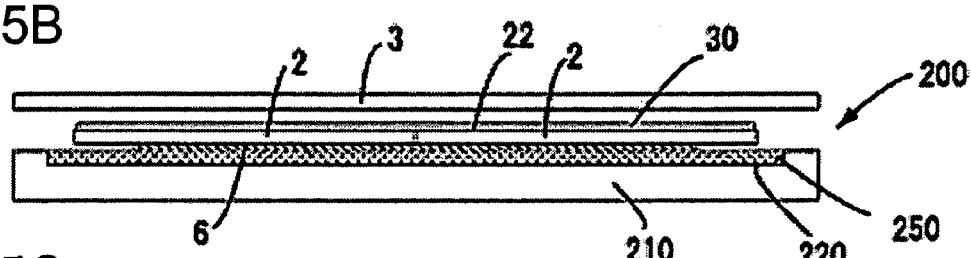
Figure 15C:
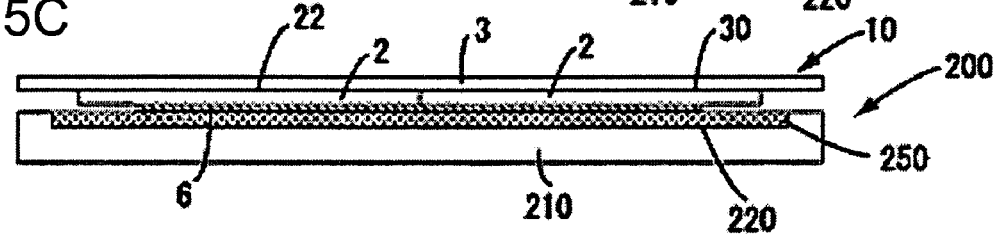

Subsequently, as shown in FIG. 15(A), the other surfaces (the polished surfaces) 22 of the small substrates 2 are cleaned. Then, as shown in FIG. 15(B), the adhesive 30 is applied on the other surfaces 22 of the small substrates 2, and as shown in FIG. 15(C), the large substrate 3 is superposed on the other surfaces 22 of the small substrates 2. Subsequently, the adhesive 30 is hardened. At that time, the fluid pressure is also applied to the large substrate 3 to press the large substrate 3 against the surface plate 210, thereby improving the adhesion between both the substrates. As a method of applying the fluid pressure to the large substrate 3, the following methods can be used: a method of ejecting compressed air from the head toward the substrates 3; and a method of forming a partition film having elasticity on the large substrate 3 and of supplying a fluid, such as air or liquid, into one of two spaces partitioned by the partition film, in which the one space is opposite to the side where the large substrate 3 is arranged.

Figure 15D:
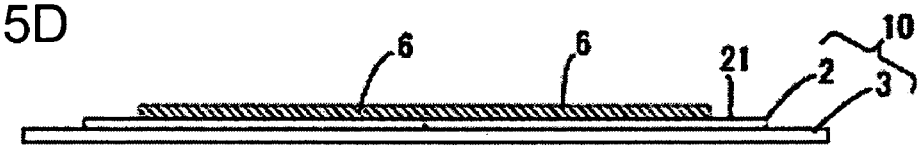

In this way, the plurality of small substrates 2 are bonded to the large substrate 3 on the surface plate 210 to form a substrate 10, and then the hardened wax 250 is indirectly heated through the surface plate 210 or is directly heated up to a temperature of about 80° C. to be melted. Then, as shown in FIG. 15(D), the small substrates 2 (the bonded substrate 10) are taken out from the concave portion 220 of the surface plate 210.

Figure 15E:
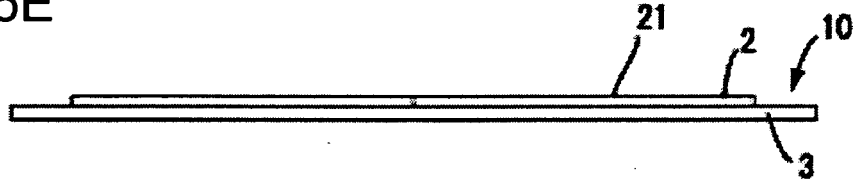

Subsequently, UV rays are irradiated onto the protective film 6 to peel off the protective film 6 as shown in FIG. 15(E). At that time, the adhesive layer 63 is also completely removed from the other surface 21 of each of the substrates 2. Then, the bonded substrate 10 is cleaned.

Figure 15F:
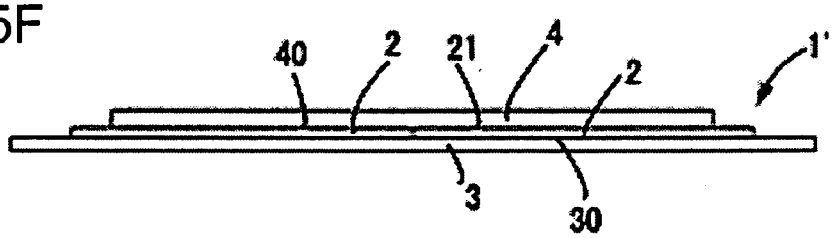

In this way, the bonded substrate 10 shown in FIG. 8(A) is manufacture, and the light-emitting functional layer is then formed. Since the following processes are the same as those in the first embodiment of the present invention, a description thereof will be omitted. As shown in FIG. 15(F), the substrate 10 having the organic EL light-emitting functional layer manufactured in this way is bonded to the sealing substrate 4 with the sealing resin 40 interposed therebetween to form a module 1'. The organic EL display device 1 shown in FIGS. 1(A) and 1(B) is manufactured using the module 1'.

Further, it is possible to adjust the sizes of the large substrate 3 and the sealing substrate 4 by cutting these substrates using a laser. As shown in FIGS. 15(E) and 15(F), after the plurality of small substrates 2 and the large substrate 3 are bonded to each other to form the bonded substrate 10, or after the sealing substrate 40 is stacked on the large substrate 3 with the electro-optical device substrate 2 interposed therebetween to form the module 1', the sealing substrate 4 or the large substrate 3 may be thinned down by polishing. In this case, the bonded substrate 10 or the module 1' may be fixed to the surface plate 210 by the wax 250, and the above-mentioned rubbing process and polishing process may be performed on the substrate by the polishing apparatus 200 shown in FIGS. 14(B), 14(C), and 14(D).

Main Effects of the Present Embodiment

As described above, in the present embodiment, since the small substrates 2 are thinned down after predetermined processes, the thickness of the small substrates 2 is maintained as it is until the thinning process. Therefore, even when the small substrate 2 composed of a hard substrate made of glass is thinned down to a thickness of 100 μm or less, preferably a thickness of 50 μm or less, the substrate is not damaged. Therefore, it is possible to simultaneously polish the plurality of small substrates 2, which results in high manufacturing yield.

Further, since the thinning of the small substrates 2 is performed by mechanical polishing, not chemical etching, the surfaces of the small substrates 2 become smooth. Therefore, even when a large number of terminals 20 are formed on the small substrate 2, a surface of the small substrate 2 opposite to the terminal forming surface can be selectively polished. Thus, the terminals 20 are not damaged.

Furthermore, it is possible to fix the small substrates 2 to the surface plate 210 only by hardening the melted wax, and it is possible to detach the electro-optical device substrates 2 from the surface plate 210 only by melting the wax 250 after polishing is completed. Therefore, if the wax 250 is used for fixation, stress for fixation is not concentrated on a portion of the electro-optical device substrate 2. Thus, the substrate is not damaged.

Moreover, since the surfaces of the plurality of small substrates 2 are flatten by polishing, it is possible to easily and accurately bond the large substrate 3 to the small substrates 2 on the surface plate 210.

Further, in the present embodiment, processes required for a laser annealing technique or a photolithography technique, such as a process of forming the TFTs 123 and 124 and a process of forming the pixel electrodes 111, are performed before the small substrates are bonded to the large substrate 3. In addition, after the bonding process, the light-emitting functional layer of the organic EL element 101 may be formed by an inkjet method capable of easily applying a liquid material at any position. Thus, even when the light-emitting functional layer 110 is formed in a large area where the plurality of small substrates 2 are arranged in a plane, it is possible to manufacture an organic EL display device using a small-sized manufacturing apparatus and to prevent a decrease in manufacturing yield.

Furthermore, in the present embodiment, since sides of the small substrate 2 are cut by a laser before the bonding process, it is possible to bond the small substrates 2 with high positional accuracy in a state in which the organic EL display device 1 is assembled. Therefore, when forming the light-emitting functional layer 110 using the inkjet method, the light-emitting functional layer 110 can be accurately formed at a predetermined position on the small substrate 2.

Moreover, in the present embodiment, the bonding process is performed in a state in which the protective film 6 adheres to the other surface 21 of each of the small substrates 2. Therefore, in the thinning process and the bonding process, it is possible to prevent the damage of the TFTs 123 and 124 caused by the sticking of impurities or external force. In addition, the sticking of impurities or damage does not occur.

Further, the large substrate 3 is bonded to the surfaces 21 of the small substrates 2 on which the protective film 6 is formed. When the light-emitting functional layer 110 is formed by the inkjet method, the falling distance of a liquid droplet from the inkjet head 9 to any small substrate 2 is uniform. Therefore, it is possible to prevent the deviation of the forming position of the light-emitting functional layer 110 or a variation in the diameter of a liquid droplet landed on the substrate caused by a variation in the falling distance. Thus, it is possible to display a high-quality image.

Furthermore, in the bonding process, fluid pressure is applied to the large substrate 3 to press the large substrate 3 against the surface plate 210, so that the large substrate 3 and the small substrates 2 are bonded to each other. Therefore, uniform force is applied to the large substrate 3 and the small substrates 2, and thus all small substrates 2 can be bonded in the same condition. Thus, it is possible to the positional deviation of the small substrates 2 in which the organic EL display device 1 is formed in the thickness direction thereof, and thus it is possible to display a high-quality image without image distortion.

Seventh Embodiment

Figure 16A:
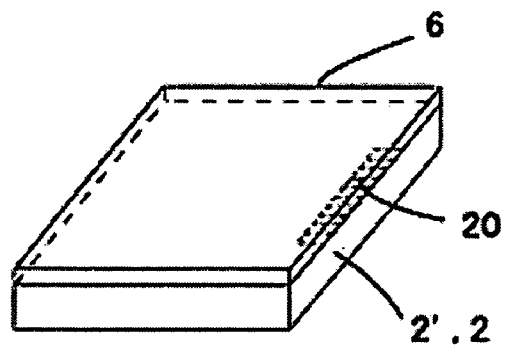
FIG. 16(A) is a perspective view of a small substrate according to a sixth embodiment of the present invention.
Figure 16B:
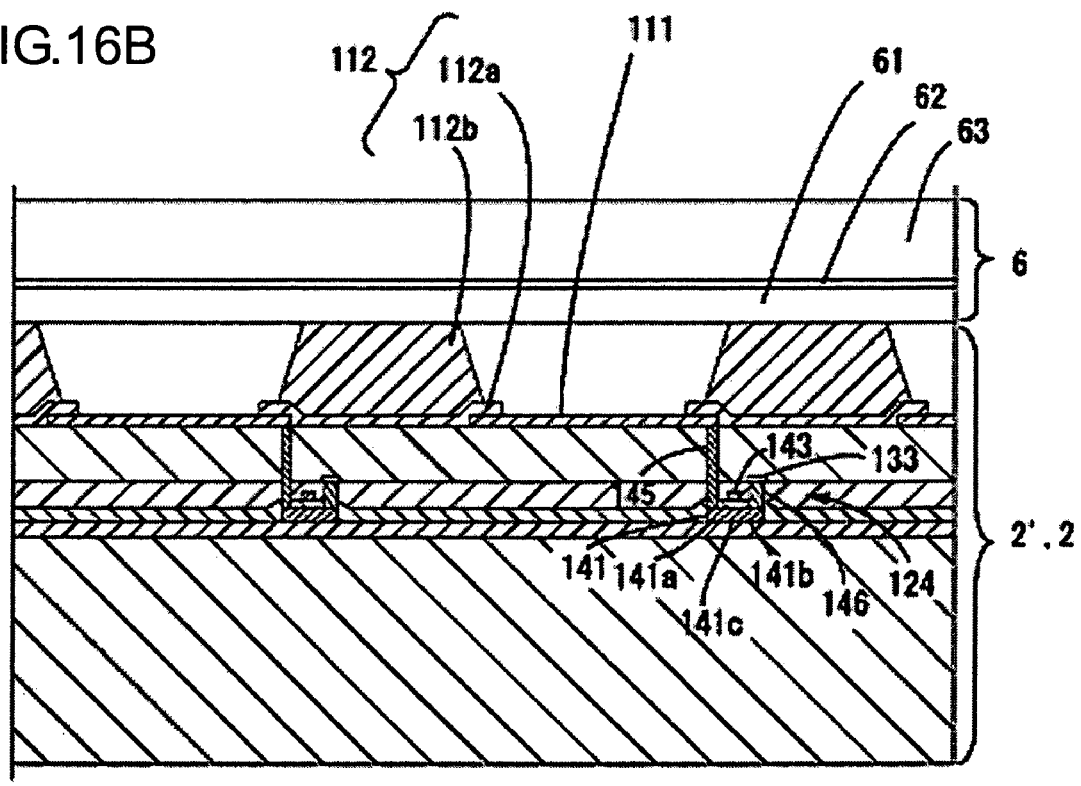
FIG. 16(B) is an enlarged cross-sectional view schematically illustrating the sectional structure of one pixel region.

FIGS. 16(A) and 16(B) are explanatory diagrams illustrating a state in which the manufacture of a small substrate is completed using a method of manufacturing an organic EL display device according to a seventh embodiment of the present invention. FIGS. 17(A) to 17(E) are cross-sectional views illustrating a process of thinning a panel among the processes of manufacturing the organic EL display device shown in FIG. 1. FIGS. 18(A) to 18(D) are cross-sectional views illustrating a process of thinning the panel and of connecting a flexible wiring substrate to terminals among the processes of manufacturing the organic EL display device shown in FIG. 1. In addition, the organic EL display device according to the present embodiment has the same basic structure as that in the first embodiment. Therefore, components having the same function as those in the first embodiment are represented by the same reference numerals, and a description thereof will be omitted for simplicity of explanation.

In manufacturing an organic EL display device 1, according to the present embodiment, as shown in FIGS. 16(A) and 16(B), circuit elements, such as TFTs 123 and 124, a pixel electrode 111 of an organic EL element 101, a partition wall 112, etc., are formed on a small substrate 2. In this process, the electro-optical device substrate 2 is a thick glass substrate 2' which is not subjected to a thinning process and has a thickness of, for example, 0.5 mm.

Further, as shown in FIGS. 16(A) and 16(B), a protective film 6 adheres to one surface 21 of the small substrate 2 (a protective film adhering process). In the present embodiment, the protective film 6 adheres so as to cover the entire surface of the small substrate 2. In addition, it is preferable that a laser beam be irradiated to cut the small substrate 2 together with the protective film 6, thereby adjusting the outward appearance of the substrate. The cutting of the small substrate 2 by the laser is performed on at least two sides of the substrate adjacent to other small substrates 2 in a state in which the substrates are arranged as shown in FIGS. 1(A) and 1(B).

Next, the small substrate 2' is thinned down by the polishing apparatus 200 shown in FIG. 14(C). The thinning process is performed according to the procedure of the sixth embodiment shown in FIG. 14. The plurality of small substrates 2 subjected to the thinning process is bonded to the large substrate 3 according to the processes of the sixth embodiment shown in FIG. 15, and the light-emitting layer of the first embodiment is then formed. These manufacturing processes and manufacturing method are similar to those in the sixth and first embodiments, and thus a description thereof will be omitted for simplicity of explanation.

Figure 17A:
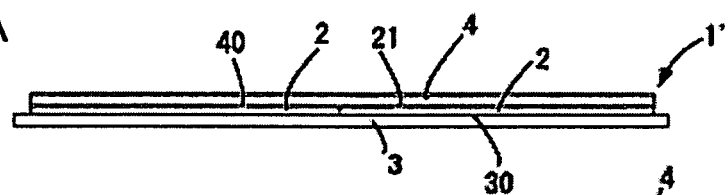
FIGS. 17(A)-17(E) are cross-sectional views illustrating a polishing process in a large substrate thinning process according to the present invention.

Subsequently, as shown in FIG. 17(A), the sealing substrate 4 having a size larger than or equal to a total size of the plurality of small substrates 2 is bonded to one surface 21 of each of the small substrates 2 with the sealing resin 40 interposed therebetween to form a panel 1'. In this stage, the terminals 20 formed in the small substrates are covered with the sealing substrate 4.

Figure 17B:
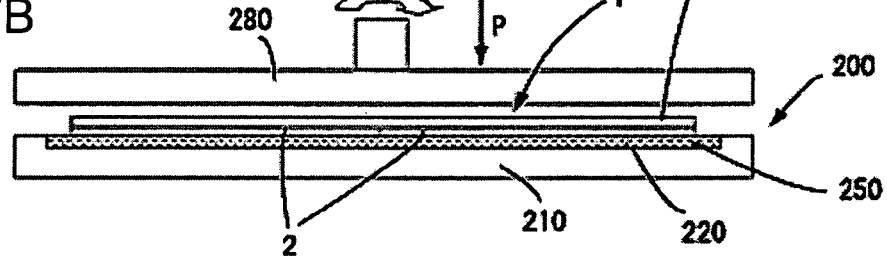

Then, the panel 1' is thinned down by the polishing apparatus 200 shown in FIG. 17(B). As shown in FIG. 17(B), the panel 1' is fixed on the surface plate 210 of the polishing apparatus 200 with the sealing substrate 4 upward (a fixing process). In this process, the wax 250 is indirectly heated through the surface plate 210 or is directly heated up to a temperature of about 80° C. to be melted. Then, the panel 1' is arranged such that the large substrate 3 is opposite to the surface of the melted wax 250, and fluid pressure is applied to the panel 1' to press it against the concave portion 220 of the surface plate. At that time, compressed air is ejected from the head toward panel 1'. Alternatively, a partition film having elasticity formed on the panel 1', and a fluid, such as air or liquid, is supplied into one of two spaces partitioned by the partition film, in which the one space is opposite to the side where the panel 1' is arranged. In this way, it is possible to apply uniform force to the respective small substrates 2.

Then, the melted wax 250 is naturally or forcibly cooled down to a temperature of 25° C. to be solidified.

Subsequently, the substrates are thinned down. In the thinning process, the polishing head 280 is arranged above the panel 1' and is rotated on its axial line, and at the same time, the surface plate 210 is rotated at a speed different from the rotation speed of the polishing head 280. In this state, a suspension consisting of whetstone grains is supplied between the polishing head 280 and the panel 1', and at the same time, a load of about 150 g/cm² is applied in the direction of arrow P. Then, the surface of the substrate 2 is polished at a speed of about 7.2 µm/min, so that the substrate 2 is thinned down from 5 mm, which is an initial thickness, to 25 µm (a rubbing process).

Figure 17C:
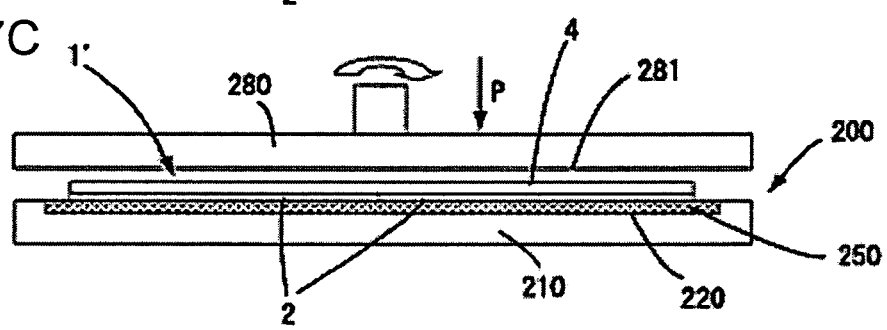

Next, as shown in FIG. 17(C), a polishing process is performed as follows. A soft abrasive cloth 281 is attached to the lower side of the polishing head 280, and the suspension consisting of whetstone grains is supplied between the polishing head 280 and the panel 1' if necessary. At the same time, a load of about 50 g/cm² is applied in the direction of arrow P to flatten the rubbed surface. In this way, the small substrate 2 can have transmittance equal to that of glass.

Successively, the hardened wax 250 is indirectly heated through the surface plate 210 or is directly heated up to a temperature of about 80° C. to be melted. Then, the panel 1' is detached from the surface plate 210.

Figure 17D:
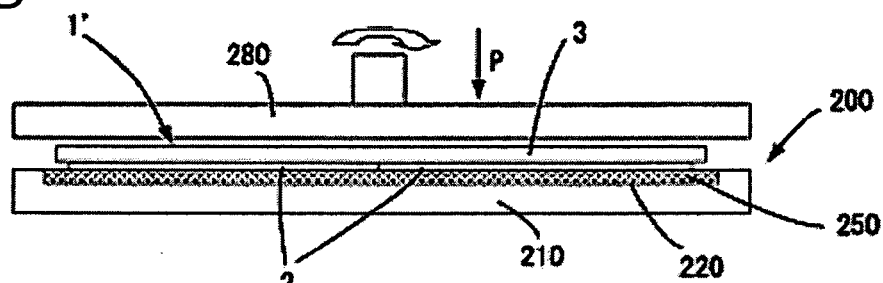
Figure 17E:
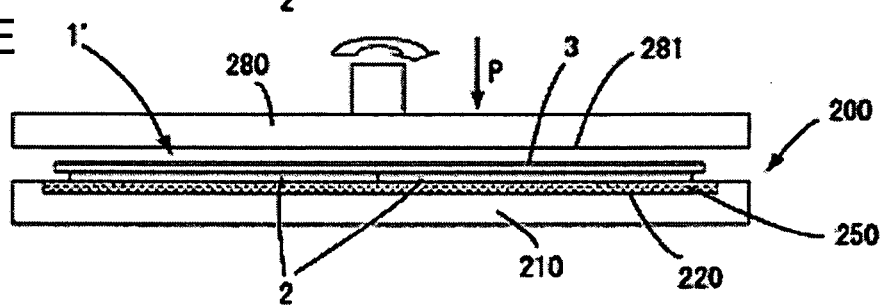

Further, as shown in FIGS. 17(B), 17(C), and 17(D), when the large substrate 3 is thinned down, the panel 1' is fixed on the surface plate 210 of the polishing apparatus 200 with the large substrate 3 faced upward, and the surface of the large substrate 3 is then polished such that the large substrate 3 is thinned down from a thickness of 0.5 mm to a thickness of 25 µm (the rubbing process). Then, as shown in FIG. 17(E), after the surface of the large substrate 3 is planarized (the polishing process), the panel 1' is detached from the surface plate 210 (FIG. 18(A)).

Figure 18A:
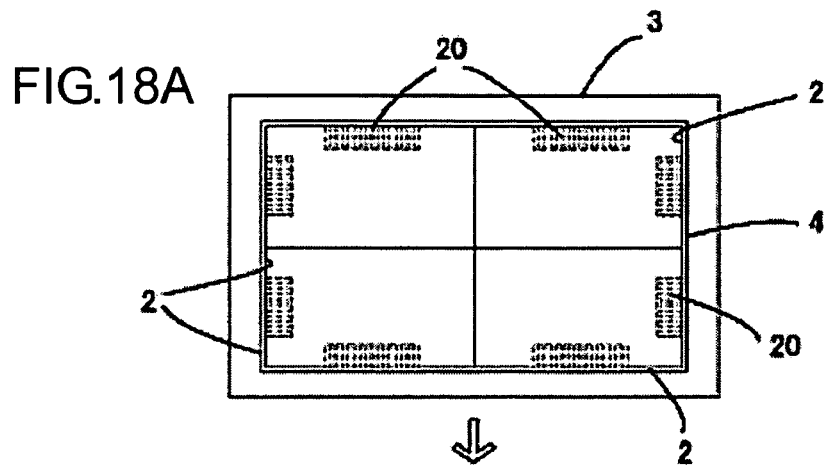
FIGS. 18(A) to 18(D) are flow diagrams illustrating a process of cutting a sealing substrate and of mounting flexible wiring substrates according to the present invention.
Figure 18B:
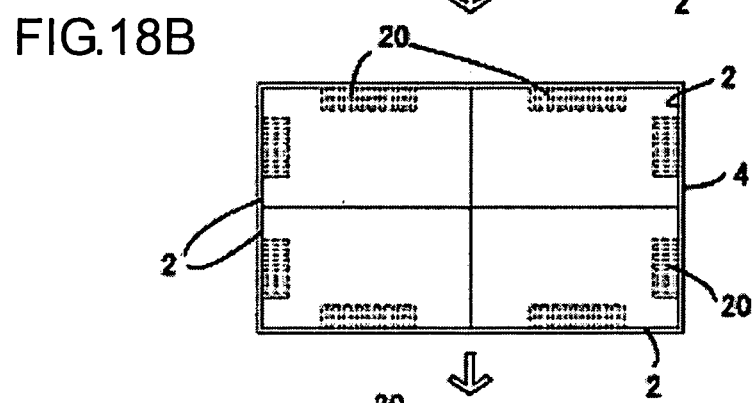

Next, after cleaning the panel 1', a laser beam is irradiated onto the large substrate 3 to cut the edge thereof as shown in FIG. 18(B). In this way, it is possible to adjust the size of the large substrate 3.

Figure 18C:
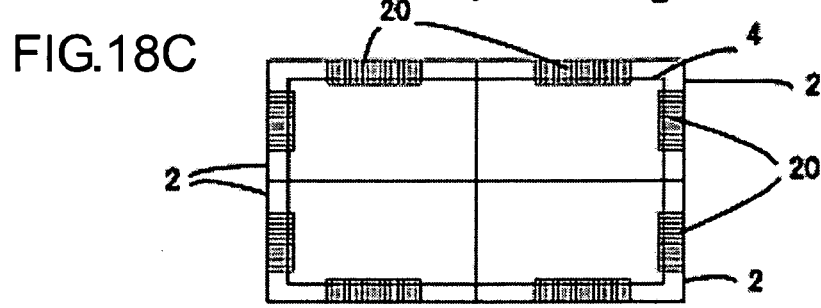
Figure 18D:
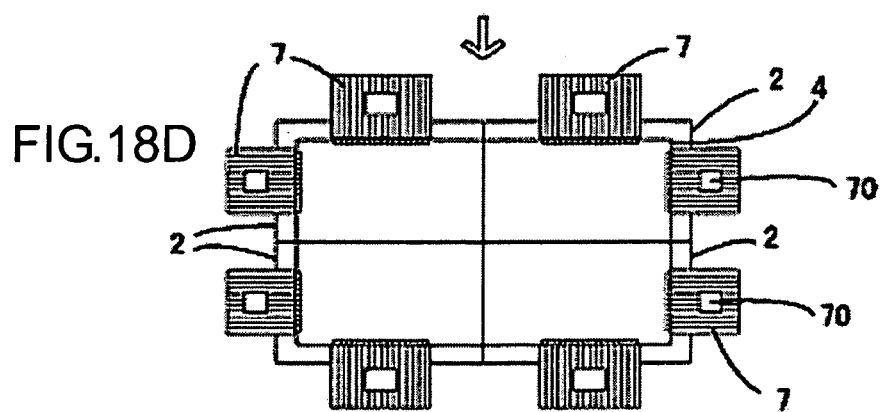

Subsequently, as shown in FIG. 18(C), a laser beam is irradiated on the sealing substrate 4 so as to cut the upper parts of the terminals 20, thereby adjusting the size of the sealing substrate 4. As a result, the terminals 20 formed in the small substrates 2 are exposed. In addition, as shown in FIG. 18(D), flexible wiring substrates 7 on which ICs 70 are mounted in a COF manner are connected to the terminals 20.

Main Effects of the Present Embodiment

As describe above, in the present embodiment, in order to achieve a thin panel, the thinning process is performed after the small substrates and the sealing substrate are bonded to each other. When the sealing substrate made of glass is thinned down to a thickness of, for example, 100 µm or less, preferably 50 µm or less, a counter substrate is not damaged during a manufacturing process. In addition, since a mechanical polishing method, not a chemical etching method, is used as a thinning method, the terminals formed in the small substrates are not etched. Further, since the terminals are covered with the sealing substrate in the polishing process, the terminals are not damaged. In addition, the exposure of the terminals is easily performed by cutting the sealing substrate after polishing.

Furthermore, in the fixing process, since fluid pressure is applied to the panel 1' to be fixed to the surface plate 210, it is possible to apply uniform force to the entire surface of the panel 1', Therefore, the panel 1' can be fixed to the surface plate 210 at an appropriated position, and thus it is possible to accurately perform polishing.

Moreover, in the polishing process, the panel 1' is fixed to the surface plate 210 by the wax 250. Therefore, after completing the polishing process, it is possible to detach the panel 1' from the surface plate 210 only by melting the wax 250. In addition, when the panel 1' is fixed by the wax 250, stress for fixation is not concentrated on a portion of the panel 1', so that the panel 1' is not damaged. Further, since the wax 250 is melted at a temperature of 80° C., an organic EL material does not deteriorate although the panel 1' holds the organic EL material.

First Modification of the Present Embodiment

Figure 19:
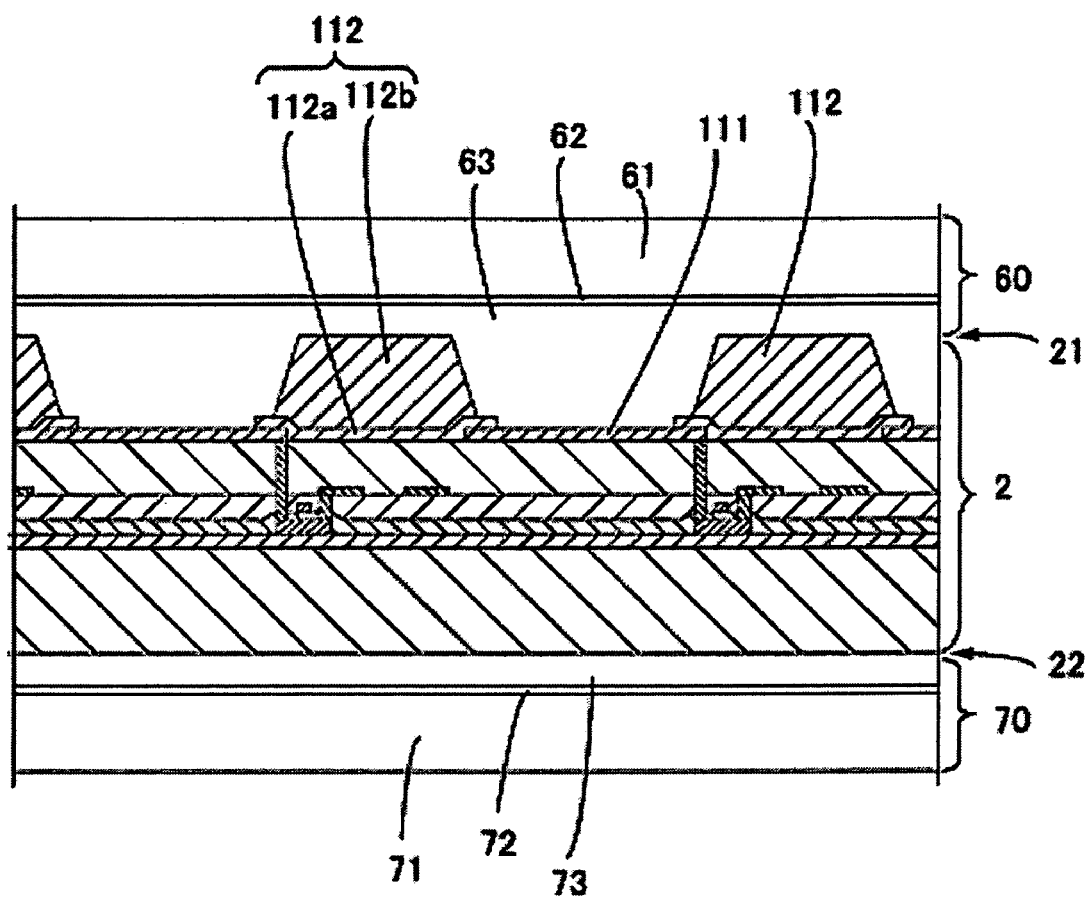
FIG. 19 is an explanatory diagram illustrating a state in which a protective film adheres to a small substrate in another method of manufacturing the organic EL display device according to the present invention.

As shown in FIG. 19, if an adhesive layer 63 having a thickness larger than the height of the partition wall 112 is used in a film base 61 as the protective film 6 used in the processes shown in FIGS. 6, 13, and 16, it is possible to prevent air bubbles from being generated between the small substrate 2 and the protective film 6 when the protective film 6 is bonded to the other surface 21 of the small substrate 2. Therefore, unevenness caused by the air bubbles is not generated on the surface of the protective film 6. Thus, when the small substrates 2 are bonded to the large substrate 3, it is possible to accurately align the position of the other surface 21 each of the small substrates 2. As a result, the light-emitting functional layer 110 can be stably formed by the inkjet method, and it is possible to prevent the positional (height) deviation of the small substrates 2 in the thickness direction thereof in a state in which the organic EL display device 1 is assembled. Thus, the display device according to the present invention can display a high-quality image.

Figure 20A:
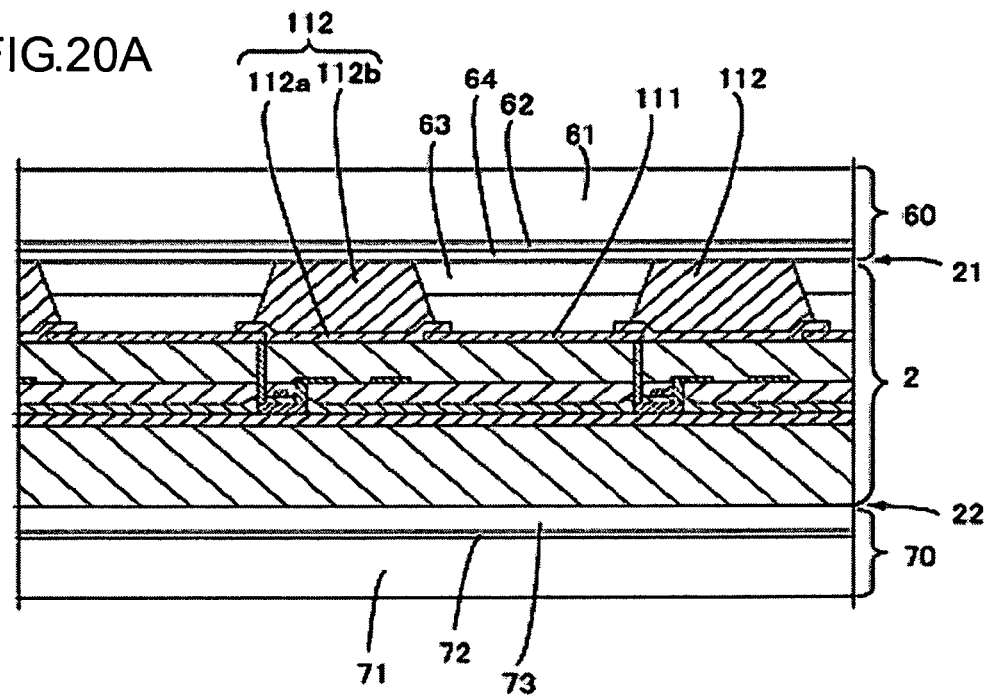
FIGS. 20(A) and 20(B) are explanatory diagrams illustrating a state in which a protective film adheres to a small substrate in still another method of manufacturing the organic EL display device according to the present invention.
Figure 20B:
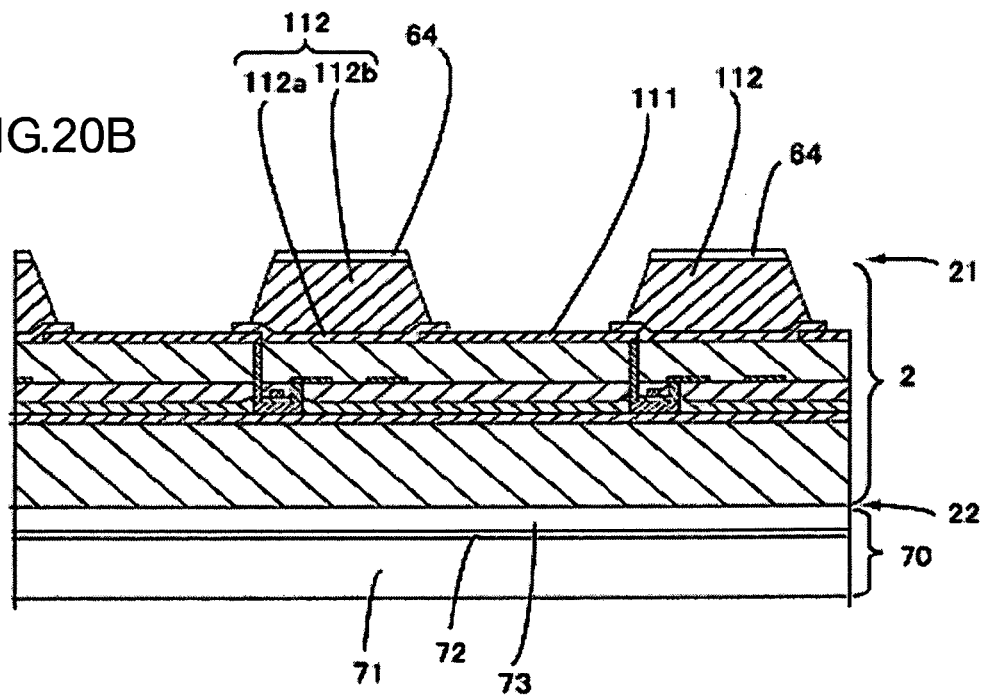

Further, as shown in FIG. 20(A), a lyophobic material layer 64 with respect to a liquid composition for forming the light-emitting functional layer 110 is additionally formed in the protective film 6, and the adhesive layer 63 is formed to have a thickness smaller than the height of the partition wall 112. In this case, after removing the protective film 6, it is possible to transfer the liquid-repellant material layer 64 to the circumstance of a region in which the liquid composition is applied, that is, to a top end portion of the partition wall 112 as shown in FIG. 20(B). Therefore, it is not necessary to perform a special lyophobic process, such as a plasma process using a fluorine compound on the other surface 21 of the small substrate 2, which results in a decrease in the number of manufacturing processes.

Furthermore, in the present embodiment, the organic EL display device 1 is used as an example. However, the present invention can be applied to the manufacture of self-emitting type electro-optical devices using other self-emitting elements.

Application to Electronic Apparatus

The electro-optical device according to the present invention is preferably mounted to electronic apparatuses having a screen larger than 30 inches. Further, it goes without saying that the present invention can be applied large or small display devices by the same kind of manufacturing method or technical idea.

What is claimed is:

1. A method of manufacturing an electro-optical device in which a plurality of substrates each having a plurality of pixel regions arranged in a matrix are arranged in a plane, each of the plurality of pixel regions including a pixel switching element and a self-emitting element, the method comprising:
a step of forming small substrates each having the pixel switching elements and pixel electrodes of the self-emitting elements formed on one surface;
a step of bonding a large substrate to the other surfaces of a plurality of the small substrates arranged in a plane; and
a step of forming a light-emitting functional layer of the self-emitting element by selectively applying a liquid composition to a predetermined region of the one surface of each of the plurality of small substrates using an inkjet method.

2. The method of manufacturing an electro-optical device according to claim 1,
wherein, in the bonding step, the small substrates and the large substrate are bonded to each other by an adhesive.

3. The method of manufacturing an electro-optical device according to claim 1, further comprising:
before the bonding step, a step of laser-cutting one or more of a plurality of sides of one small substrate adjacent to other small substrates in the electro-optical device using a laser.

4. The method of manufacturing an electro-optical device according to claim 3,
wherein alignment marks indicating positions where a laser beam is irradiated are formed on the small substrates.

5. The method of manufacturing an electro-optical device according to claim 1,
wherein, after the small substrate forming step, a protective film is adhered to at least the one surface of each of the small substrates, and
wherein, after the bonding step, the protective film is removed from the one surface of each of the small substrates, and the light-emitting functional layer forming step is then performed.

6. The method of manufacturing an electro-optical device according to claim 5,
wherein, in the bonding step, the plurality of small substrates are arranged such that the protective film faces a surface plate, and in this state, the large substrate is bonded to the other surfaces of the plurality of small substrates.

7. The method of manufacturing an electro-optical device according to claim 6,
wherein, in the bonding step, the large substrate is placed in contact with the other surfaces of the plurality of small substrates arranged on the surface plate, and
in this state, fluid pressure is applied to the large substrate to press against the surface plate such that the large substrate is bonded to the other surfaces of the plurality of small substrates.

8. The method of manufacturing an electro-optical device according to claim 1,
wherein, in the bonding step, the large substrate and the small substrates are bonded to each other with first substrate-gap-controlling members interposed therebetween for controlling a gap between the substrates.

9. The method of manufacturing an electro-optical device according to claim 8,
wherein the first substrate-gap-controlling members are projections formed on the small substrates or the large substrate.

10. The method of manufacturing an electro-optical device according to claim 9,
wherein the first substrate-gap-controlling members are composed of a photosensitive resin formed by a photolithography technique.

11. The method of manufacturing an electro-optical device according to claim 9,
wherein the first substrate-gap-controlling members are composed of a resin composition fixed on the small substrates or the large substrate by a transferring method, a printing method, or an inkjet method.

12. The method of manufacturing an electro-optical device according to claim 9,
wherein the first substrate-gap-controlling members are formed in regions other than the region overlapping the forming region of the self-emitting element in plan view.

13. The method of manufacturing an electro-optical device according to claim 8,
wherein the first substrate-gap-controlling members are granular or rod-shaped gap materials dispersed between the small substrates and the large substrate.

14. The method of manufacturing an electro-optical device according to claim 8, further comprising:
after forming the self-emitting elements, a sealing step of bonding a sealing substrate to the one surface of each of the small substrates.

15. The method of manufacturing an electro-optical device according to claim 14,
wherein, in the sealing step, the small substrates and the sealing substrate are bonded to each other by a sealing resin.

16. The method of manufacturing an electro-optical device according to claim 14,
wherein, in the sealing step, the sealing substrate and the small substrates are bonded to each other with second substrate-gap-controlling members interposed therebetween for controlling a gap between the substrates.

17. The method of manufacturing an electro-optical device according to claim 16,
wherein the second substrate-gap-controlling members are projections formed on the small substrates or the sealing substrate.

18. The method of manufacturing an electro-optical device according to claim 17,
wherein the second substrate-gap-controlling members are composed of a photosensitive resin formed by a photolithography technique.

19. The method of manufacturing an electro-optical device according to claim 17,
wherein the second substrate-gap-controlling members are composed of a resin composition fixed on the small substrates or the sealing substrate by a transferring method, a printing method, or an inkjet method.

20. The method of manufacturing an electro-optical device according to claim 17,
wherein the second substrate-gap-controlling members are formed in regions other than the region overlapping the forming region of the self-emitting element in plan view.

21. The method of manufacturing an electro-optical device according to claim 16,
wherein the second substrate-gap-controlling members are granular or rod-shaped gap materials dispersed between the small substrates and the sealing substrate.

22. The method of manufacturing an electro-optical device according to claim 1, further comprising:

a step of fixing the plurality of small substrate arranged in a plane to a surface plate using wax, after the small substrate forming step;

a step of thinning down the small substrates by polishing the surfaces of the small substrates; and a step of detaching the small substrates from the surface plate by melting the wax by heating.

23. The method of manufacturing an electro-optical device according to claim 22, wherein, in the thinning step, a rubbing step of thinning down the small substrates in a state in which the small substrates are fixed to the surface plate by the wax and a polishing step of smoothly polishing the surfaces of the small substrates are sequentially performed.

24. The method of manufacturing an electro-optical device according to claim 22, wherein, in the fixing step, the wax, which is in a concave portion formed on an upper surface of the surface plate, is melted by heating, wherein the plurality of small substrates is dipped in the melted wax, and fluid pressure is applied to the plurality of small substrates to press against the surface plate, and wherein the wax is solidified by cooling such that the plurality of small substrates is fixed to the surface plate by the wax.

25. The method of manufacturing an electro-optical device according to claim 22, wherein the large substrate is bonded to the plurality of small substrates on the surface plate to form a bonded substrate in which the plurality of small substrates are arranged in a plane on the large substrate, and the bonded substrate is then detached from the surface plate by melting the wax by heating.

26. The method of manufacturing an electro-optical device according to claim 25, wherein, in the bonding step, the fluid pressure is applied to the large substrate in a state in which the large substrate is placed in contact with the plurality of small substrates on the surface plate, such that the large substrate presses against the surface plate.

27. The method of manufacturing an electro-optical device according to claim 1, wherein the electro-optical device in which the plurality of electro-optical device substrates are arranged in a plane on the large substrate is manufactured using the bonded substrate obtained by the following steps:

the small substrate forming step of forming the pixel switching elements and the pixel electrodes of the self-emitting elements in the one surface of the small substrate;

the fixing step of fixing the plurality of small substrates arranged in a plane to the surface plate by the wax, with the electrode surfaces facing downward;

the polishing step of polishing the other surfaces of the plurality of small substrates;

the bonding step of manufacturing the bonded substrate by bonding the large substrate to the polished surfaces of the plurality of small substrates;

the detaching step of detaching the bonded substrate from the surface plate by melting the wax; and the light-emitting functional layer forming step of forming the light-emitting functional layer of the self-emitting elements on one surface of the bonded substrate composed of the plurality of small substrates.

28. The method of manufacturing an electro-optical device according to claim 27, wherein the large substrate is thinned down by polishing the surface of the large substrate in a state in which the bonded substrate is fixed to the surface plate by the wax, and wherein the bonded substrate is detached from the surface plate by melting the wax by heating.

29. The method of manufacturing an electro-optical device according to claim 27, wherein after the sealing substrate is bonded to the one surface of each of the plurality of small substrate constituting the bonded substrate to form a module at a side opposite to the bonded substrate, the sealing substrate is thinned down by polishing the surface of the sealing substrate in a state in which the module is fixed to the surface plate by the wax, and the module is then detached from the surface plate by melting the wax by heating.

30. The method of manufacturing an electro-optical device according to claim 29, wherein each small substrate has a plurality of terminals, and wherein the method further comprises a step of cutting the sealing substrate such that the terminals are exposed after the step of thinning down the sealing substrate.

31. The method of manufacturing an electro-optical device according to claim 30, wherein, in the cutting step, the sealing substrate is cut by a laser.

32. The method of manufacturing an electro-optical device according to claim 1, wherein the small substrate has partition walls for defining regions in which the liquid composition is applied, and wherein the protective film has an adhesive layer formed on one surface of a film base whose thickness is larger than the height of the partition walls.

33. The method of manufacturing an electro-optical device according to claim 1, wherein the small substrate has partition walls for defining regions in which the liquid composition is applied, wherein, in the protective film, a lyophobic material layer with respect to the liquid composition and an adhesive layer having a thickness larger than the height of the partition walls are formed on one surface of a film base, and wherein, when the protective film is removed, in the periphery of the regions in which the liquid composition is applied, the lyophobic material layer is transferred to the small substrate.

34. An electro-optical device manufactured by the method according to claim 1.

35. An electronic apparatus comprising the electro-optical device according to claim 34.

* * * * *